United States Patent
Kojima et al.

(10) Patent No.: US 7,123,510 B2
(45) Date of Patent: Oct. 17, 2006

(54) NON-VOLATILE SEMICONDUCTOR MEMORY DEVICE

(75) Inventors: Makoto Kojima, Suita (JP); Takafumi Maruyama, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/058,374

(22) Filed: Feb. 16, 2005

(65) Prior Publication Data

US 2005/0180212 A1 Aug. 18, 2005

(30) Foreign Application Priority Data

Feb. 16, 2004 (JP) ............................. 2004-038291

(51) Int. Cl.
*G11C 16/04* (2006.01)

(52) U.S. Cl. .................................. 365/185.03; 365/210

(58) Field of Classification Search ............ 365/185.03
See application file for complete search history.

(56) References Cited

U.S. PATENT DOCUMENTS

| 5,615,153 | A | 3/1997 | Yiu et al. |
| 5,963,465 | A | 10/1999 | Eitan |
| 6,128,226 | A | 10/2000 | Eitan et al. |
| 6,157,580 | A | 12/2000 | Kohno |
| 6,262,914 | B1 | 7/2001 | Smayling et al. |
| 6,272,043 | B1 | 8/2001 | Hollmer |
| 6,351,415 | B1 | 2/2002 | Kushnarenko |
| 6,711,058 | B1 * | 3/2004 | Hirano ................. 365/185.11 |
| 6,788,611 | B1 * | 9/2004 | Hsu et al. ............. 365/230.05 |
| 2002/0167853 | A1 * | 11/2002 | Kojima ................... 365/202 |
| 2002/0196698 | A1 * | 12/2002 | Eitan ................... 365/230.04 |

* cited by examiner

*Primary Examiner*—Thong Q. Le
(74) *Attorney, Agent, or Firm*—McDermott Will & Emery LLP

(57) ABSTRACT

A plurality of memory cells are connected between two adjacent sub-bit lines. A row decoder 3 selects a word line connected to a memory cell to be read. A selection line selection circuit 2 and a column selection circuit 5 include first and second selection portions that perform selection operations simultaneously and independently. The first selection portion selects a first pair of main bit lines and selection lines in order to select the memory cell to be read. The second selection portion selects a second pair of main bit lines that is different from the first pair of main bit lines and selection lines for selecting a sector different from that for the memory cell to be read in order to select a line to be used for reading a reference voltage.

23 Claims, 19 Drawing Sheets

NON-VOLATILE SEMICONDUCTOR MEMORY DEVICE

BACKGROUND OF THE INVENTION

1. Field of the Invention

The present invention relates to a non-volatile semiconductor memory device. More specifically, the present invention relates to a non-volatile semiconductor memory device having a matrix-shaped memory cell area including a plurality of memory cells arranged in a plurality of rows and a plurality of columns.

2. Description of the Background Art

As one configuration of a non-volatile semiconductor memory device, VGA (virtual ground array) is known. The VGA configuration refers to a configuration in which adjacent memory cells share a diffusion layer. The area of the non-volatile semiconductor memory device can be reduced by adopting the VGA configuration. FIG. 17 shows a non-volatile semiconductor memory device having the VGA configuration. The non-volatile semiconductor memory device shown in FIG. 17 has the VGA configuration and has a hierarchical bit line structure including main bit lines and sub-bit lines.

The non-volatile semiconductor memory device shown in FIG. 17 is divided into three areas A to C. FIG. 17 shows main bit lines MOi, MEi, MOi+1, MEi+1, and sub-bit lines 91Ai to 94Ai, 91Ai+1 to 94Ai+1, 91Bi to 94Bi, 91Bi+1 to 94Bi+1 as the lines in the column direction (vertical direction). FIG. 17 also shows word lines AWLB, BWLB, and selection lines SEL1U to SEL4U, SEL1L to SEL4L as the lines in the row direction (horizontal direction). The word line AWLB is connected to the gates of memory cells AP to AV, and the word line BWLB is connected to the gates of memory cells BP to BV. Selection transistors, which are switches for controlling connection between the main bit lines and the sub-bit lines, are disposed between the main bit lines and the sub-bit lines, if necessary. The main bit lines and the sub-bit lines form a hierarchical structure with the main bit lines at the top and the sub-bit lines at the bottom.

The operation of the non-volatile semiconductor memory device shown in FIG. 17 that is configured as above will be described. As an example, the case where "a read on the source side" with respect to a memory cell BQ is performed will be described. A memory cell storing data "0" is referred to as "being in a program state", and a memory cell storing data "1" is referred to as "being in an erase state". In order to perform a read on the source side with respect to a memory cell, it is necessary to apply voltages of about 4.5 V, about 0 V (substantially ground voltage) and about 1 V to the gate, the source and the drain of the memory cell, respectively.

As shown in FIG. 17, the drain of the memory cell BQ is connected to the sub-bit line 92Bi, and the sub-bit line 92Bi is connected to the main bit line MEi via a selection transistor 95. The source of the memory cell BQ is connected to the sub-bit line 93Bi, and the sub-bit line 93Bi is connected to the main bit line MOi via a selection transistor 96. Therefore, in order to perform a read on the source side with respect to a memory cell BQ, a voltage of about 3 V is applied to the selection lines SEL2L, SEL1U to control the selection transistors 95, 96 to be ON, and voltages of about 1 V, about 0 V and about 4.5 V can be applied to the main bit lines MEi, MOi and the word line BWLB, respectively. Thus, voltages of about 4.5 V, about 0 V (substantially ground voltage) and about 1 V can be applied to the gate, the source and the drain of the memory cell BQ, respectively.

When a predetermined voltage is applied to each line in this manner and the data stored in the memory cell BQ is "0", the threshold value of the gate voltage is high, so that almost no current flows from the main bit line MEi to the main bit line MOi. Consequently, the potential of the main bit line MOi is not substantially increased. On the other hand, when the data stored in the memory cell BQ is "1", the threshold value of the gate voltage is low, so that a current flows from the main bit line MEi to the main bit line MOi. Consequently, the potential of the main bit line MOi is increased by a voltage corresponding to the current that has flown. Therefore, data can be read from the memory cell BQ by detecting the voltage of the main bit line MOi.

Whether the data read from the memory cell BQ is "0" or "1" can be determined in the following manner. A sense amplifier (not shown) amplifies and outputs a difference between a voltage of the main bit line MOi during a read operation and a predetermined voltage that serves as a reference (hereinafter, referred to as "reference voltage"). When the voltage of the main bit line MOi is higher than the reference voltage, it is determined that the read data is "1". On the other hand, when the voltage of the main bit line MOi is lower than the reference voltage, it is determined that the read data is "0".

A reference cell is used to generate the reference voltage as described above. The reference cell is designed to output the reference voltage when it is controlled to be ON. The reference cell is constituted by, for example, a MOS transistor. Such a reference cell is often disposed outside the memory cell area in the non-volatile semiconductor memory device as shown in FIG. 17.

Data read from one memory cell is output to the outside of the memory cell area via the main bit line and the sub-bit line connected to the memory cell. The main bit lines and the sub-bit lines used for reading data are associated with a parasitic capacitance in accordance with the lengths of the bit lines, whether or not there are other bit lines adjacent to the bit lines, or the number of connected memory cells or the like. This parasitic capacitance is a factor that may delay a data read operation. More specifically, when the parasitic capacitance is large, the delay amount during a data read becomes large, and when the parasitic capacitance is small, the delay amount during a data read becomes small.

As described above, the reference cell is often provided in a predetermined position outside the memory cell area. Therefore, unlike the memory cell, it is difficult to connect the reference cell to the main bit lines, which are connected to a plurality of memory cells and the sub-bit lines. Therefore, the line connected to the reference cell is not associated with a parasitic capacitance that is equal to the parasitic capacitance associated with the main bit line connected to the memory cell. Consequently, a phenomenon occurs in which, the parasitic capacitance generated on the side of the memory cell to be read as seen from the sense amplifier does not match the parasitic capacitance generated on the side of the reference cell (this phenomenon is referred to as "capacitance unbalance"). When such capacitance unbalance occurs, the delay amount when the voltage of the main bit line connected to the memory cell is output does not match the delay amount when the reference voltage is output from the reference cell.

Regarding this problem, a method for equalizing the parasitic capacitance associated with the bit line on the memory cell side as seen from the sense amplifier with the parasitic capacitance associated with the line on the reference cell side is known. The method will be described in detail with reference to FIG. 17 below.

As described above, when reading data from the memory cell BQ, the main bit lines MOi, MEi, and the sub-bit lines 92Bi, 93Bi are used. Therefore, when reading data from the memory cell BQ, a parasitic capacitance in accordance with the length of each of the bit lines is associated therewith. Then, the line with which a parasitic capacitance equal to the parasitic capacitance associated with each of the bit lines is associated can be connected to the reference cell. Thus, the parasitic capacitance associated with the bit line connected to the reference cell can be equal to the parasitic capacitance associated with the bit line connected to the memory cell BQ.

More specifically, the same voltage as the voltage applied to the main bit line and the sub-bit line used for a data read is applied to the main bit line and the sub-bit line that are not used for a data read, and these bit lines can be connected to the reference cell. For example, when reading data from the memory cell BQ, voltages of about 0 V and about 1 V are applied to the main bit lines MOi+1, MEi+1, respectively (thus, voltages of about 0 V and about 1 V are also applied to the sub-bit lines 93Bi+1, 92Bi+1, respectively), and the main bit lines MOi+1, MEi+1 can be connected to the reference cell. Thus, the bit line connected to the reference cell is associated with the same parasitic capacitance as that of the bit line connected to the memory cell BQ. Regarding the above-described technique, U.S. Pat. Nos. 5,963,465 and 6,351,415 (hereinafter, referred to as "Reference 1" and "Reference 2") can be referred to.

However, the method for allowing the parasitic capacitance to be associated in the above-described manner has the following problem. Data is read from a memory cell connected to the same word line as the selected memory cell (e.g., memory cell BU in the case where the memory cell BQ is selected), and thus the non-volatile semiconductor memory device may malfunction.

In order to solve this problem, a non-volatile semiconductor memory device shown in FIG. 18 is known. FIG. 18 is a diagram showing the configuration of a non-volatile semiconductor memory device disclosed in U.S. Pat. No. 6,128,226 (hereinafter, referred to as "Reference 3"). The non-volatile semiconductor memory device shown in FIG. 18 will be described.

The non-volatile semiconductor memory device shown in FIG. 18 includes memory cells, bit lines BL, word lines WL, reference bit lines BLR, a Y decoder 1000, a reference unit 1002 and a sense amplifier 1004. The memory cells are arranged in a matrix. The bit lines BL are arranged in the column direction between the memory cells arranged in a matrix. The words lines WL are arranged in the row direction between the memory cells arranged in a matrix. The reference bit lines BLR are lines with which a parasitic capacitance equal to the parasitic capacitance associated with the bit lines BL is associated during a data read operation. The Y decoder 1000 connects the bit line BL to the sense amplifier 1004, the memory cell to be read being connected to the bit line BL. The reference unit 1002 generates a reference voltage Vref that serves as a reference. The sense amplifier 1004 amplifies and output a difference between the voltage Vcell of the bit line BL output from the Y decoder 1000 and the reference voltage Vref.

In the non-volatile semiconductor memory device shown in FIG. 18, a data read is performed in the following manner. First, when reading data from a certain memory cell, data is read out to the Y decoder 1000, using two bit lines BL connected to the diffusion layer of this memory cell and a word line WL connected to the gate of this memory cell. The Y decoder 1000 outputs the voltage Vcell of the bit line BL connected on the drain side to the sense amplifier 1004.

On the other hand, the reference unit 1002 generates the reference voltage Vref, and outputs it to the sense amplifier 1004. In this case, two reference bit lines BLR are selected, and connected to the reference unit 1002. Thus, the parasitic capacitance associated with the bit lines BL connected to the memory cell to be read can be equal to the parasitic capacitance associated with the reference lines BLR connected to the reference unit 1002. That is to say, the problem of capacitance unbalance can be solved. Consequently, the delay amount in reading from the memory cell can be equal to the delay amount in reading from the reference unit 1002.

Regarding the non-volatile semiconductor memory device, U.S. Pat. No. 6,272,043 (hereinafter, referred to as "Reference 4") discloses a method for performing a read on the source side in a non-volatile semiconductor memory device as shown in FIG. 19. In the non-volatile semiconductor memory device shown in FIG. 19, a reference circuit 2045 includes a reference current source 2040 and a current/voltage converting circuit 2050, a memory arrangement 2015 includes a virtual ground array 2000 and a current/voltage converting circuit 2030. The current/voltage converting circuit 2050 is constituted by a resistance element and converts a current generated in the reference current source 2040 to a reference voltage 2055. The current/voltage converting circuit 2030 is constituted by a resistance element and converts a current output from a memory cell in the virtual ground array 2000 to a read voltage 2065. A comparing circuit 2060 is constituted by a differential amplifier and compares the reference voltage 2055 and the read voltage 2065. Thus, the state of the memory cell in the virtual ground array 2000 can be determined.

However, the non-volatile semiconductor memory device shown in FIG. 18 has a problem in that it is difficult to reduce the size of the circuit. More specifically, in the non-volatile semiconductor memory device shown in FIG. 18, extra reference bit lines BLR for generating a read delay in the reference cell are provided. Therefore, it is necessary to provide an area in which the reference bit lines BLR are provided in the non-volatile semiconductor memory device.

SUMMARY OF THE INVENTION

Therefore, an object of the present invention is to provide a non-volatile semiconductor memory device that has a VGA configuration and can determine accurate data determination while suppressing an increase in the area of the circuit.

The present invention has the following features to attain the object mentioned above.

In a non-volatile semiconductor memory device according to the present invention, a column selection circuit selects a column in the memory cell area, a row selection circuit selects a row in the memory cell area. A plurality of word lines is connected to the row selection circuit, each word line being provided corresponding to each row of memory cells; a plurality of main bit lines is connected to the column selection circuit, each main bit line extending in the direction of the columns; a plurality of sub-bit lines is provided in each sector, each sub-bit line extending in the direction of the columns. A plurality of selection transistors are each provided corresponding to each sub-bit line, each selection transistor being capable of electrically conducting or not electrically conducting between the sub-bit line and a corresponding one of the plurality of main bit lines; and a plurality of selection lines extend in the direction of the rows and are connected to the row selection circuit, each selection line applying a voltage to control electrodes of corresponding ones of the plurality of selection transistors for switching the selection transistors between a conducting state and a non-conducting state. Each memory cell is connected between two adjacent sub-bit lines. The row selection circuit selects a word line connected to a memory cell to be read. The column selection circuit includes a first selection portion for selecting a first pair of main bit lines and two of the plurality of selection lines, thereby selecting the memory cell to be read; and a second selection portion for selecting a second pair of main bit lines and two other of the plurality of selection lines, thereby selecting a line for reading a reference voltage to be used for data determination, wherein the second pair of main bit lines is different from the first pair of main bit lines, and the two other selection lines are to be used for selecting a sector different from a sector to which the memory cell to be read belongs, and the first and second selection portion perform the respective selections simultaneously and independently of each other.

The non-volatile semiconductor memory device may further include a plurality of reference cells each generating the reference voltage, and when data is read from the memory cell to be read, a corresponding one of the plurality of reference cells may be connected to the line for reading the reference voltage selected by the second selection portion.

The plurality of reference cells may be disposed outside any sector which contains any memory cells.

Each reference cell may be disposed within each sector, the reference cell being connected between two adjacent sub-bit lines.

As the second pair of main bit lines, the second selection portion may select a pair of main bit lines adjoining the first pair of main bit lines.

As the two other selection lines, the second selection portion may select selection lines to be used for selecting a sector adjoining the sector to which the memory cell to be read belongs.

Furthermore, the row selection circuit and the column selection circuit may further include an adjustment portion for, if a capacitance associated with the sector to which the memory cell to be read belongs is not equal to a capacitance associated with a sector selected by the selection lines selected by the second selection portion, coupling a capacitive portion to a pair of main bit lines of the sector which is associated with the smaller capacitance.

If a capacitance associated with the sector to which the memory cell to be read belongs is not equal to a capacitance associated with a sector selected by the selection lines selected by the second selection portion, the column selection circuit may adjust an amount of current flowing to the reference cell in accordance with a ratio between a parasitic capacitance associated with the first pair of main bit lines and a parasitic capacitance associated with the second pair of main bit lines.

If a capacitance associated with the sector to which the memory cell to be read belongs is not equal to a capacitance associated with a sector selected by the selection lines selected by the second selection portion, the column selection circuit may adjust a sense timing for the memory cell and the reference cell in accordance with a ratio between the capacitance associated with the sector to which the memory cell to be read belongs and the capacitance associated with the sector selected by the selection lines selected by the second selection portion.

The row selection circuit and the column selection circuit may further include a load capacitance addition portion for, if a capacitance associated with the sector to which the memory cell to be read belongs and a capacitance associated with a sector selected by the selection lines selected by the second selection portion are each smaller than a capacitance associated with another sector in the memory cell, additionally coupling a capacitive portion to the first pair of main bit lines and the second pair of main bit lines so as to result in a parasitic capacitance which is equal to a capacitance associated with the largest sector in the memory cell area.

The sectors may be diversified into types of different sizes and structures, such that at least two sectors exist for each type.

In response to a designation of an address of a memory cell, the row selection circuit and the column selection circuit may simultaneously erase data stored in the memory cells contained in a plurality of sectors including the sector to which the memory cell having the designated address belongs.

Furthermore, a sense amplifier detects a difference between two input voltages. The first pair of main bit lines may be composed of a first main bit line and a second main bit line, and the second pair of main bit lines may be composed of a third main bit line and a fourth main bit line. The first selection portion selects signal lines such that a drain voltage to be applied to a drain of the memory cell to be read is applied to the first main bit line, and a voltage which is substantially equal to a ground voltage is applied to the second main bit line. The second selection portion selects signal lines such that the drain voltage to be applied to the drain of the memory cell to be read is applied to the third main bit line, and a voltage which is substantially equal to the ground voltage is applied to the fourth main bit line, and the second main bit line and the fourth main bit line may be connected to the sense amplifier.

Each reference cell may be disposed within each sector, the reference cell being connected between two adjacent sub-bit lines. The non-volatile semiconductor memory device may further include a plurality of reference word lines extending in the direction of the rows and connected to the row selection circuit, each reference word line being connected to control electrodes of corresponding ones of the plurality of reference cells. When data is read from the memory cell to be read, the row selection circuit may select and activate one of the plurality of reference word lines from which to read the reference voltage, while keeping inactive and not selecting the reference word line connected to the sector to which the memory cell to be read belongs.

Furthermore, the first selection portion selects signal lines such that a voltage which is lower than a voltage applied to a selection line connected to the selection transistor for connecting the first main bit line to a sub-bit line connected to the drain of the memory cell to be read is applied to a selection line connected to the selection transistor for connecting the second main bit line to a sub-bit line connected to a source of the memory cell to be read. The second selection portion selects signal lines such that a voltage which is lower than a voltage applied to a selection line connected to the selection transistor for connecting the third main bit line to a sub-bit line connected to a drain of the reference cell is applied to a selection line connected to the selection transistor for connecting the fourth main bit line to a sub-bit line connected to a source of the reference cell.

A sense amplifier detects a difference between two input voltages. The first pair of main bit lines are composed of a first main bit line and a second main bit line. The second pair of main bit lines are composed of a third main bit line and a fourth main bit line. The first selection portion selects signal lines such that a drain voltage to be applied to a drain of the memory cell to be read is applied to the first main bit line, and a voltage which is substantially equal to a ground voltage is applied to the second main bit line. The second selection portion selects signal lines such that a voltage which is substantially equal to the ground voltage is applied to the fourth main bit line, and a selection line for connecting the third main bit line to a corresponding one of the plurality of sub-bit lines is kept inactive. The second main bit line and the fourth main bit line are connected to the sense amplifier.

A sense amplifier detects a difference between two input voltages. The first pair of main bit lines are composed of a first main bit line and a second main bit line. The second pair of main bit lines are composed of a third main bit line and a fourth main bit line. The first selection portion selects signal lines such that a voltage which is substantially equal to a drain voltage to be applied to a drain of the memory cell to be read is applied to the first main bit line, a ground voltage is applied to the second main bit line, and by further selecting a selection line connected to the selection transistor for connecting the first main bit line to a sub-bit line adjoining a sub-bit line connected to a drain of the memory cell to be read, a voltage is applied via the selection transistor to the sub-bit line adjoining the sub-bit line connected to the drain of the memory cell to be read, the voltage being substantially equal to the drain voltage. The second selection portion selects signal lines such that a voltage which is substantially equal to the drain voltage to be applied to the drain of the memory cell to be read is applied to the third main bit line, the ground voltage is applied to the fourth main bit line, and during a data read, by further selecting a selection line connected to the selection transistor for connecting the third main bit line to a sub-bit line adjoining a sub-bit line connected to the third main bit line, a voltage is applied via the selection transistor to the sub-bit line adjoining the sub-bit line connected to the third main bit line, the voltage being substantially equal to the drain voltage. The first main bit line and the third main bit line are connected to the sense amplifier.

A sense amplifier detects a difference between two input voltages. The first pair of main bit lines are composed of a first main bit line and a second main bit line. The second pair of main bit lines are composed of a third main bit line and a fourth main bit line. The first selection portion selects signal lines such that a voltage which is substantially equal to a drain voltage to be applied to a drain of the memory cell to be read is applied to the first main bit line, a ground voltage is applied to the second main bit line, and by further selecting a selection line connected to the selection transistor for connecting the first main bit line to a sub-bit line adjoining a sub-bit line connected to a drain of the memory cell to be read, a voltage is applied via the selection transistor to the sub-bit line adjoining the sub-bit line connected to the drain of the memory cell to be read, the voltage being substantially equal to the drain voltage. The second selection portion is operable to select the third main bit line without applying to the third main bit line a voltage which is substantially equal to the drain voltage to be applied to the drain of the memory cell to be read, and select signal lines such that the ground voltage is applied to the fourth main bit line, and during a data read, by further selecting a selection line connected to the selection transistor for connecting the third main bit line to a sub-bit line adjoining a sub-bit line connected to the third main bit line, a voltage is applied via the selection transistor to the sub-bit line adjoining the sub-bit line connected to the third main bit line, the voltage being substantially equal to the drain voltage. The first main bit line and the third main bit line are connected to the sense amplifier.

Furthermore, first and second sense amplifiers each detect a difference between two input voltages. The first pair of main bit lines are composed of a first main bit line and a second main bit line. The second pair of main bit lines are composed of a fourth main bit line and a fifth main bit line. The first selection portion is operable to select signal lines such that a drain voltage to be applied to a drain of the memory cell to be read is applied to the first main bit line, and a voltage which is substantially equal to a ground voltage is applied to the second main bit line, further select a third main bit line adjoining the first main bit line such that a voltage which is substantially equal to the ground voltage is applied to the third main bit line, and further select a selection line connected to the selection transistor for connecting the third main bit line to a sub-bit line connected to a source of a memory cell having a drain which is connected to the drain of the memory cell to be read. The second selection portion is operable to select signal lines such that the drain voltage is applied to the fourth main bit line, and a voltage which is substantially equal to the ground voltage is applied to the fifth main bit line, further select a sixth main bit line adjoining the fourth main bit line such that a voltage which is substantially equal to the ground voltage is applied to the sixth main bit line, and further select a selection line for selecting the selection transistor for connecting the sixth main bit line to a sub-bit line adjoining the sub-bit line connected to the fifth main bit line. The second main bit line and the fifth main bit line are connected to the first sense amplifier for reading data from the memory cell to be read, and the third main bit line and the sixth main bit line are connected to the second sense amplifier for reading data from the memory cell having a drain which is connected to the drain of the memory cell to be read.

A plurality of reference cells generate the reference voltage, each reference cell being disposed within each sector and connected between two adjacent sub-bit lines, and a plurality of reference word lines extending in the direction of the rows and connected to the row selection circuit, each reference word line being connected to control electrodes of corresponding ones of the plurality of reference cells. When data is read from the memory cell to be read, a corresponding one of the plurality of reference cells is connected to the line for reading the reference voltage selected by the second selection portion. When data is read from the memory cell to be read, the row selection circuit may select and activate one of the plurality of reference word lines from which to read the reference voltage, while keeping inactive and not selecting the reference word line connected to the sector to which the memory cell to be read belongs.

A sense amplifier may amplify a voltage difference between the reference voltage and a voltage on one of the first pair of main bit lines from which to read data, the sense amplifier having inputs of opposite polarities; and a polarity inversion circuit may couple the main bit line from which to read data always to the same one of the inputs of the sense amplifier.

The memory cell may be capable of storing information of 1 bit or more.

In the non-volatile semiconductor memory device of the present invention, a plurality of word lines are each provided corresponding to each row of memory cells; a plurality of main bit lines each extend in the direction of the columns; a plurality of sub-bit lines are provided in each sector, each sub-bit line extending in the direction of the columns; a plurality of selection transistors are each provided corresponding to each sub-bit line, each selection transistor being capable of electrically conducting or not electrically conducting between the sub-bit line and a corresponding one of the plurality of main bit lines; and a plurality of selection lines extend in the direction of the rows, each selection line applying a voltage to control electrodes of corresponding ones of the plurality of selection transistors for switching the selection transistors between a conducting state and a non-conducting state. Each memory cell may be connected between two adjacent sub-bit lines, and each sector may include at least as many selection lines as are necessary to control a selection transistor for connecting a first pair of sub-bit lines connected to the memory cell to be read to a first pair of main bit lines capable of being coupled to the first pair of sub-bit lines, and a selection transistor for connecting a second pair of main bit lines to a second pair of sub-bit lines capable of being coupled to the second pair of main bit lines, wherein the second pair of main bit lines is different from the first pair of main bit lines.

According to the non-volatile semiconductor memory device of the present invention, an operation of selecting lines for selecting a memory cell to be read and an operation of selecting lines for reading a reference voltage are performed independently and simultaneously. Therefore, malfunction does not occur during a data read operation. Furthermore, the main bit lines in the memory cell area are used to solve the capacitance unbalance during read of a reference voltage and to read data in a memory cell. Therefore, it is not necessary to provide anew lines for solving the capacitance unbalance during read of a reference voltage.

Furthermore, disturbances due to erase or program can be reduced by providing the reference cells outside the sectors.

Furthermore, the reference cells can be arranged in a position having excellent periodicity by arranging the reference cells in a matrix in a sector in the same manner as the memory cells. As a result, a stable reference voltage can be obtained.

When a second pair of main bit lines that are adjacent to a first pair of main bit lines are used, the parasitic capacitances associated with these pairs of main bit lines are close, because the selected pairs of main bit lines are adjacent. As a result, it is possible to solve the capacitance unbalance more accurately.

When a sector adjacent to a sector to which a memory cell to be read belongs is used as a sector that is to be selected by a selection line that is selected by a second selection portion, problems such as mismatch of parasitic capacitances, noise, and delay that may occur when sectors that are physically away are selected can be solved.

Furthermore, by adding a load capacitance to the pair of main bit lines in a smaller sector, it is possible to make a balance of the parasitic capacitances associated with the two pairs of main bit lines even in a non-volatile semiconductor memory device in which the sector size is not uniform.

When the size of selected sectors is different, the problem of the capacitance unbalance due to the difference in the size of the sectors can be solved by adjusting the amount of a current flowing through the reference cell. This configuration is particularly effective during a verify operation.

Furthermore, the problem of the capacitance unbalance due to the difference in the size of the sectors can be solved by adjusting the sense timing of the memory cell and the reference cell, based on the ratio of the size of the sector to which the memory cell to be read belongs and the size of the sector that is selected by the selection line selected by the second selection portion.

When the size of the sector to which the memory cell to be read belongs and the size of the sector that is selected by the selection line selected by the second selection portion are smaller than the size of the other sectors in the memory cell area, the problem of the capacitance unbalance also can be solved by adding a parasitic capacitance to the first and the second pairs of main bit lines so that the parasitic capacitances thereof are equal to the parasitic capacitance of the largest sector in the memory cell area so that the parasitic capacitances associated with the two pairs of main bit lines are matched with the largest parasitic capacitance.

Furthermore by providing a plurality of sectors having the same pattern, it is possible to always select two sectors having the same pattern at the same time.

These and other objects, features, aspects and advantages of the present invention will become more apparent from the following detailed description of the present invention when taken in conjunction with the accompanying drawings.

DESCRIPTION OF THE PREFERRED EMBODIMENTS

First, the outline of the non-volatile semiconductor memory device according to the present invention will be described. The memory cells provided in the non-volatile semiconductor memory device have a configuration with a floating gate interposed between a substrate and a control gate, as conventionally known, and hold binary information based on whether or not electrons are stored in the floating gate. When electrons are stored in the floating gate, the threshold value of the gate voltage applied to the control gate is high, so that even if a predetermined gate voltage is applied, substantially no current flows through the memory cells. This state is referred to as a state in which data "0" is stored. On the other hand, when electrons are not stored in the floating gate, the threshold value of the gate voltage is low, so that if the predetermined gate voltage is applied, a current flows through the memory cells. This state is referred to as a state in which data "1" is stored. Herein, the state in which electrons are not stored is referred to as an "erase state", and the state in which electrons are stored is referred to as a "program state".

The present invention is also effective for, not only a non-volatile semiconductor memory device including memory cells having a floating gate configuration, but also a non-volatile semiconductor memory device including memory cells having a MONOS structure in which charges are accumulated in a trap in a nitride film that is an insulating film interposed between oxide films to store data, mask ROM or the like.

(First Embodiment)

Figure 1:
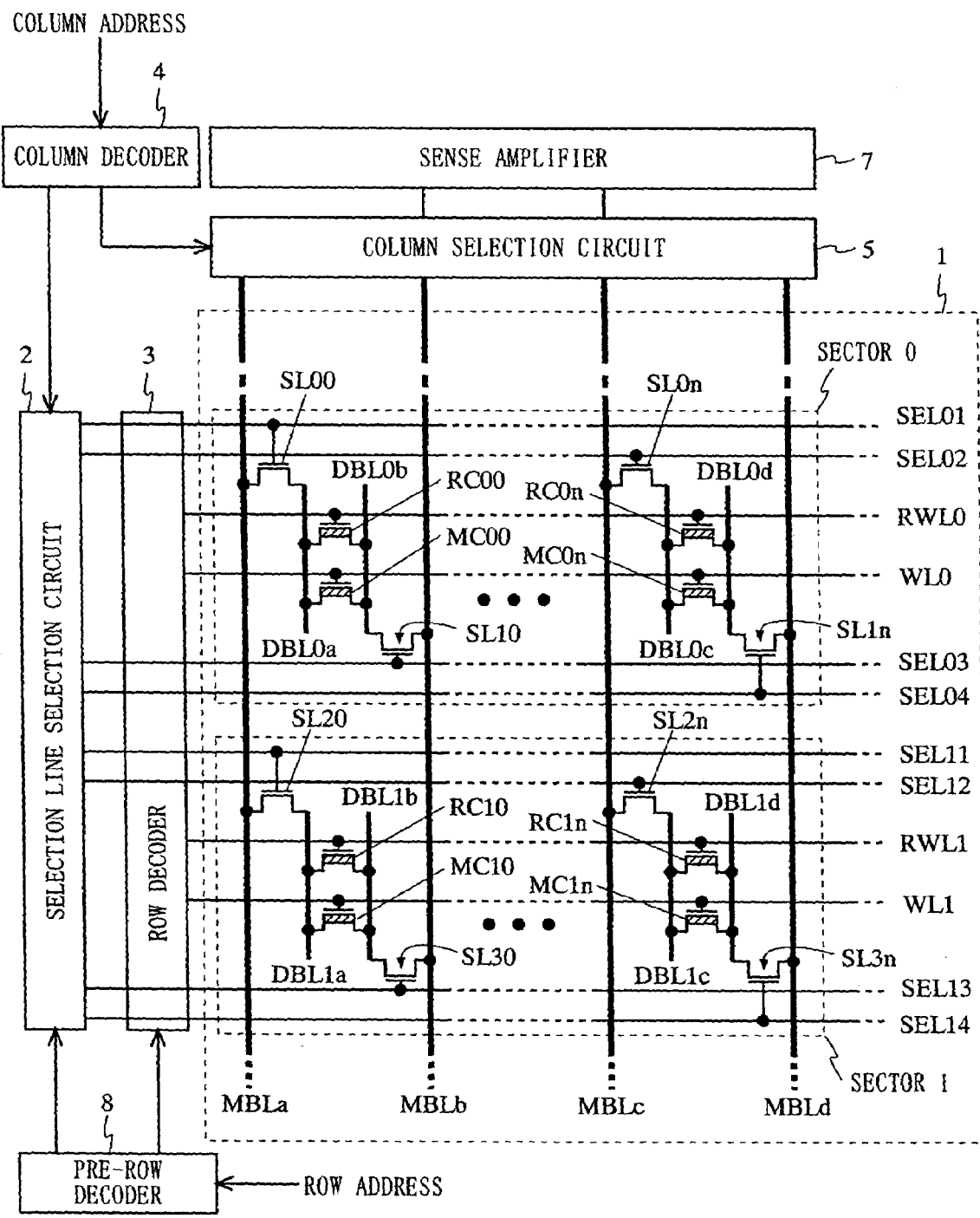
FIG. 1 is a diagram showing the configuration of a non-volatile semiconductor memory device of a first embodiment of the present invention.

A non-volatile semiconductor memory device of a first embodiment of the present invention will be described with reference to the accompanying drawings. The specific configuration of the non-volatile semiconductor memory device of this embodiment will be described later. The non-volatile semiconductor memory device of this embodiment has an effect of eliminating the unbalance between the parasitic capacitance associated with the main bit line connected to a memory cell to be read (hereinafter, referred to as "narrow sense-main bit line") and the parasitic capacitance associated with the main bit line connected to a reference cell (hereinafter, referred to as "complementary main bit line") during a read operation. FIG. 1 is a diagram showing the configuration of the non-volatile semiconductor memory device of this embodiment. The non-volatile semiconductor memory device of this embodiment is characterized by the read operation, so that, in the following, the read operation will be described.

The non-volatile semiconductor memory device shown in FIG. 1 includes a memory cell area 1, a selection line selection circuit 2, a row decoder 3, a column decoder 4, a column selection circuit 5, a sense amplifier 7 and a pre-row decoder 8. In the memory cell area 1, memory cells MC00 to MC0n, MC10 to MC1n, reference cells RC00 to RC0n, RC10 to RC1n, and selection transistors SL00 to SL0n, SL10 to SL1n, SL20 to SL2n, SL30 to SL3n are arranged. In the memory cell area 1, as the lines in the column direction, main bit lines MBLa to MBLd and sub-bit lines DBL0a to DBL0d, DBL1a to DBL1d are provided, and as the lines in the row direction, selection lines SEL01 to SEL04, SEL11 to SEL14, word lines WL0, WL1, and reference word lines RWL0, RWL1 are provided. The memory cell area 1 is divided into a plurality of sectors extending in the row direction. More specifically, in the non-volatile semiconductor memory device shown in FIG. 1, a sector 0 and a sector 1, which are rectangles that are long in the row direction, are aligned in the column direction. The number of the sectors may be at least 2, and the size of the sector may be all the same or all different from each other.

The main bit lines MBLa to MBLd extend along the column direction in the memory cell area 1 and are connected to the column selection circuit 5. The main bit lines MBLa to MBLd are used to read data from a memory cell and to read a reference voltage from a reference cell. The main bit lines MBLa to MBLd function as any one of a narrow sense-main bit line, a main virtual GND line, a complementary main bit line and a complementary main virtual GND line, depending on the memory cell from which data is to be read. The narrow sense-main bit line and the main virtual GND line are used to read data from a memory cell, and the complementary main bit line and the complementary main virtual GND line are used to read a reference voltage from a reference cell. The sub-bit lines connected to the narrow sense-main bit line, the main virtual GND line, the complementary main bit line and the complementary main virtual GND line via selection transistors are referred to as a "narrow sense-sub-bit line", "sub virtual GND line", "complementary sub-bit line" and "complementary sub virtual GND line", respectively.

For example, when reading data from a memory cell MC00, the main bit lines MBLa to MBLd function as a narrow sense-main bit line, a main virtual GND line, a complementary main bit line and a complementary main virtual GND line, respectively. In this case, the sub-bit lines DBL0a, DBL0b, DBL1c, DBL1d function as a narrow sense-sub-bit line, a sub virtual GND line, a complementary sub-bit line and a complementary sub virtual GND line, respectively.

The complementary main bit line has a potential that can be compared with the narrow sense-main bit line during the operation of the sense amplifier 7. The main virtual GND line, the complementary main virtual GND line, the sub virtual GND line, and the complementary sub virtual GND line have a potential substantially equal to the ground potential during the operation of the sense amplifier 7. Furthermore, the narrow sense-main bit line and the narrow sense-sub-bit line form a hierarchical structure with the narrow sense-main bit line at the top and the narrow sense-sub-bit line at the bottom. The similar relationship is also established between the main virtual GND line and the sub virtual GND line, between the complementary main bit line and the complementary sub-bit line, and between the complementary main virtual GND line and the complementary sub virtual GND line.

The selection transistors connect or disconnect between the main bit lines MBLa to MBLd and the sub-bit lines DBL0a to DBL0d, DBL1a to DBL1d. For example, the selection transistor SL00 connects the main bit line MBLa and the sub-bit line DBL0a when the selection line SEL01 is activated. The selection transistor SL10 connects the main bit line MBLb and the sub-bit line DBL0b when the selection line SEL03 is activated. The selection transistors other than the above operate in the same manner.

The memory cell MC00 is connected to the sub-bit lines DBL0a and DBL0b and is selected when a word line WL0 is activated. The reference cell RC00 is connected to the sub-bit lines DBL0a and DBL0b and is selected when a reference word line RWL0 is activated. The memory cells and the reference cells other than the above operate in the same manner.

The pre-row decoder 8 generates three types of row decode signals based on the row address that is input from the outside. More specifically, the pre-row decoder 8 generates a row decode signal for selecting a column in a memory cell area 1, a row decode signal for selecting a memory cell to be read, and a row decode signal for selecting a reference cell. The row decoder 3 selects a row in the memory cell area 1. More specifically, the row decoder 3 drives a word line based on the row decode signal for selecting a memory cell to be read, and drives a reference word line based on the row decode signal for selecting a reference cell.

The column decoder 4 generates two types of column decode signals based on the column address that is input from the outside. More specifically, the column decoder 4 generates a column decode signal for selecting a memory cell to be read and a column decode signal for selecting a reference cell.

The column selection circuit 5 selects a column in the memory cell area 1. More specifically, the column selection circuit 5 selects lines to be used as the narrow sense-main bit line and the main virtual GND line, based on the first column decode signal for selecting a memory cell to be read, among the main bit lines MBLa to MBLd. Furthermore, the column selection circuit 5 selects lines to be used as the complementary main bit line and the complementary main virtual GND line, based on the column decode signal for selecting a reference cell. Moreover, the column selection circuit 5 receives voltages necessary for a read operation, a program operation or an erase operation from a power source circuit (not shown) based on the two column decode signals and supplies the voltages to the narrow sense-main bit line and the complementary main bit line and also to the main virtual GND line and the complementary main virtual GND line. The selection line selection circuit 2 selects a column in the memory cell area 1. More specifically, the selection line selection circuit 2 selects a column in the memory cell area 1 by selecting selection lines SEL01 to SEL04, SEL11 to SEL14 based on the row decode signals and the column decode signals. An example of voltage values to be applied to a memory cell during a read operation has been described in the description of the background art, so that it will not be described further. Thus, the column selection circuit 5 reads out, programs and erases data with respect to a memory cell. The sense amplifier 7 amplifies and outputs a difference in voltage between the narrow sense-main bit line and the complementary main bit line or a difference in voltage between the main virtual GND line and the complementary main virtual GND line.

As described above, the main bit lines and the sub-bit lines that are to function as the narrow sense-main bit line, the main virtual GND line, the complementary main bit line or the complementary main virtual GND line, and the narrow sense sub-bit line, the sub virtual GND line, the complementary sub-bit line or the complementary sub virtual GND line can be switched, depending on the position of the memory cell to be read and the reference cell used during a read.

Hereinafter, a method for reading data in the non-volatile semiconductor memory device of this embodiment will be described. As an example, the case of reading data from a memory cell MC00 in the sector 0 will be described.

When reading data from a memory cell MC00 in the sector 0, a column address and a row address showing the position of the memory cell MC00 are input to the column decoder 4 and the pre-row decoder 8, respectively. The column decoder 4 generates a column decode signal for selecting the memory cell MC00 and a column decode signal for selecting a reference cell RC1n, based on the input column address. On the other hand, the pre-row decoder 8 generates a row decode signal for selecting a column in the memory cell area 1, a row decode signal for selecting the memory cell MC00 and a row decode signal for selecting the reference cell RC1n, based on the input row address.

The column selection circuit 5, the row decoder 3 and the selection line selection circuit 2 operate to select the memory cell in the following manner. The column selection circuit 5 activates the narrow sense-main bit line MBLa and the main virtual GND line MBLb, based on the column decode signal for selecting the memory cell MC00. The selection line selection circuit 2 activates the selection lines SEL01, SEL03, based on the row decode signal for selecting the memory cell MC00. Thus, the narrow sense-main bit line MBLa and the narrow sense-sub-bit line DBL0a are connected, and the main virtual GND line MBLb and the sub virtual GND line DBL0b are connected. Furthermore, the row decoder 3 activates the word line WL0, based on the row decode signal for selecting the memory cell MC00. Thus, the memory cell MC00 is selected.

The column selection circuit 5, the row decoder 3 and the selection line selection circuit 2 operate to select a reference cell belonging to a sector different from the sector 0 and disposed in a column different from the memory cell MC00 in order to read out a reference voltage, simultaneously and independently of the memory cell MC00. Herein, it is assumed that the reference cell RC1n in the sector 1 is selected. More specifically, the column selection circuit 5 activates the complementary main bit line MBLc and the complementary main virtual GND line MBLd, based on the column decode signal for selecting the reference cell RC1n. The selection line selection circuit 2 activates the selection lines SEL12, SEL14, based on the row decode signal for selecting the reference cell RC1n. Thus, the complementary main bit line MBLc and the complementary sub-bit line DBL1c are connected, and the complementary main virtual GND line MBLd and the complementary sub virtual GND line DBL1d are connected. Furthermore, the row decoder 3 activates the reference word line RWL1, based on the row decode signal for selecting the reference cell RC1n. Thus, the reference cell RC1n is selected.

Figure 2:
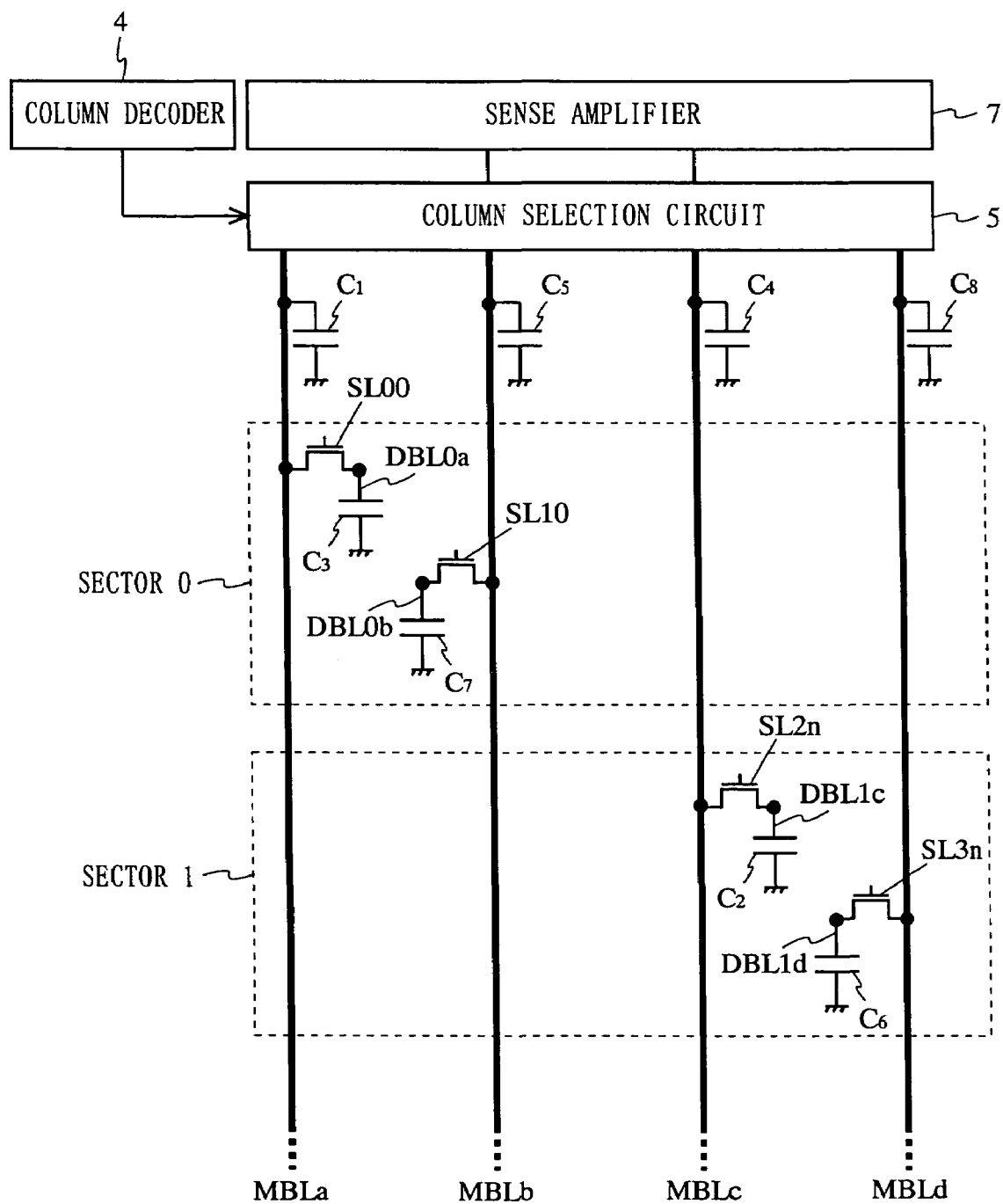
FIG. 2 is a schematic diagram of parasitic capacitances associated with the main bit lines of the memory device shown in FIG. 1.

As described above, according to the non-volatile semiconductor memory device of this embodiment, it is possible to solve the problem of capacitance unbalance that occurs on the memory cell side and the reference cell side as seen from the sense amplifier 7. Hereinafter, the reason for this will be described with reference to the accompanying drawing. FIG. 2 is a schematic diagram of parasitic capacitances associated with the main bit lines MBLa to MBLd when reading data from the memory cell MC00 in the non-volatile semiconductor memory device shown in FIG. 1.

In FIG. 2, $C_1$ denotes a parasitic capacitance of the portion excluding the sector 0, as seen from the narrow sense-main bit line MBLa. $C_2$ denotes a parasitic capacitance of the sector 1, as seen from the complementary main bit line MBLc. $C_3$ denotes a parasitic capacitance of the sector 0, as seen from the narrow sense-main bit line MBLa. $C_4$ denotes a parasitic capacitance of the portion excluding the sector 1, as seen from the complementary main bit line MBLc. $C_5$ denotes a parasitic capacitance of the portion excluding the sector 0, as seen from the main virtual GND line MBLb. $C_6$ denotes a parasitic capacitance of the sector 1, as seen from the complementary main virtual GND line MBLd. $C_7$ denotes a parasitic capacitance of the sector 0, as seen from the main virtual GND line MBLb. $C_8$ denotes a parasitic capacitance of the portion excluding the sector 1, as seen from the complementary main virtual GND line MBLd.

When reading data from the memory cell MC00, the selection transistors SL00, SL10 are controlled to be ON in the sector 0, and the selection transistor SL2n, SL3n are controlled to be ON in the sector 1. Therefore, the circuit configurations of the sectors 0 and 1 are the same. Consequently, the parasitic capacitance $C_1$ of the portion excluding the sector 0 as seen from the narrow sense-main bit line MBLa is equal to the parasitic capacitance $C_4$ of the portion excluding the sector 1 as seen from the complementary main bit line MBLc. The parasitic capacitance $C_3$ of the sector 0 as seen from the narrow sense-main bit line MBLa is equal to the parasitic capacitance $C_2$ of the sector 1 as seen from the complementary main bit line MBLc. As a result, the parasitic capacitance associated on the side of the narrow sense-main bit line MBLa as seen from the sense amplifier 7 is equal to the parasitic capacitance associated on the side of the complementary main bit line MBLc. Thus, the problem of the capacitance unbalance that occurs between the memory cell side and the reference cell side as seen from the sense amplifier 7 can be solved. The same is true for the capacitance unbalance between the main virtual GND line and the complementary main virtual GND line.

Furthermore, in the non-volatile semiconductor memory device of this embodiment, the complementary main bit line and the complementary main virtual GND line connected to the reference cell are realized by the main bit lines that already have been provided in the memory cell area 1. Therefore, unlike the non-volatile semiconductor memory device disclosed in Reference 3, in the non-volatile semiconductor memory device of this embodiment, it is not necessary to provide anew the complementary main bit line and the complementary main virtual GND line that are to be connected to the reference cell. Therefore, the problem of the capacitance unbalance that occurs between the memory cell side and the reference cell side as seen from the sense amplifier 7 can be solved without increasing the size of the memory cell area 1.

Furthermore, in the non-volatile semiconductor memory device of this embodiment, an operation of selecting a memory cell to be read and an operation of selecting a reference cell are performed simultaneously and independently. More specifically, in this non-volatile semiconductor memory device, a reference cell that belongs to a sector different from that for a memory cell to be read and that is present in a column different from that of the memory cell is used to generate a reference voltage. Therefore, malfunction of circuits, which is a problem in conventional non-volatile semiconductor memory devices, does not occur. The reason for this is as follows.

In the non-volatile semiconductor memory device of this embodiment, for example, when reading data from the memory cell MC00, the reference cell RC1n, which belongs to a sector different from that for the memory cell MC00 to be read. If a reference cell RC0n, which belongs to the same sector as the memory cell MC00, is selected, as the word line WL0 is activated, data is also read out from a memory cell MC0n that is connected to the word line WL0, and thus the circuit malfunctions.

In the non-volatile semiconductor memory device of this embodiment, for example, when the reference cell RC1n is selected, the complementary main bit line MBLc and the complementary main virtual GND line MBLd, which are different from the narrow sense-main bit line MBLa and the main virtual GND line MBLb connected to the memory cell MC00 to be read, are used. If a reference cell RC10, which belongs to a sector different from that for the memory cell MC00 but is present in the same column as the memory cell MC00, is selected, the circuit malfunctions as above. According to the non-volatile semiconductor memory device of this embodiment, these malfunctions can be prevented.

In the non-volatile semiconductor memory device of this embodiment, the reference cells are arranged in a matrix in the memory cell area 1 in the same manner as the memory cells. In other words, the reference cells are arranged in a portion having excellent periodicity in the circuit configuration. Therefore, reference cells having a more stable configuration than that of reference cells that are provided outside the memory cell area 1 can be obtained. Consequently, a stable reference voltage can be generated.

Figure 19:
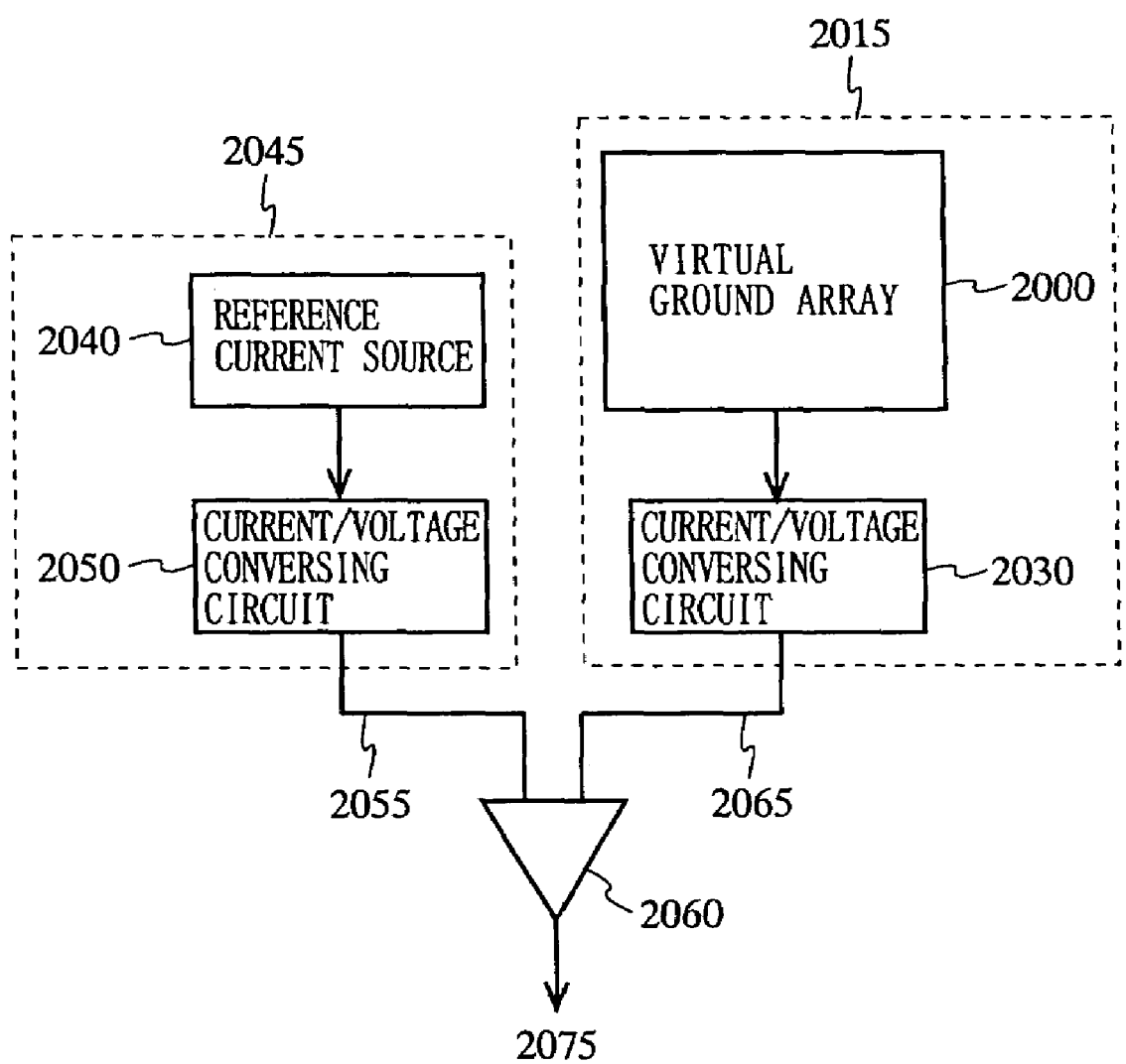
FIG. 19 is a diagram showing a third example of a conventional non-volatile semiconductor memory device.

In the non-volatile semiconductor memory device of this embodiment, the reference voltages input to the sense amplifier 7 are generated by charging (or discharging) the parasitic capacitances of the bit lines that are originally present in the memory cell area 1. Therefore, in the non-volatile semiconductor memory device of this embodiment, it is not necessary to provide the current/voltage converting circuits 2030, 2050, which are included in the non-volatile semiconductor memory device (FIG. 19) disclosed in Reference 4.

(Second Embodiment)

Figure 3:
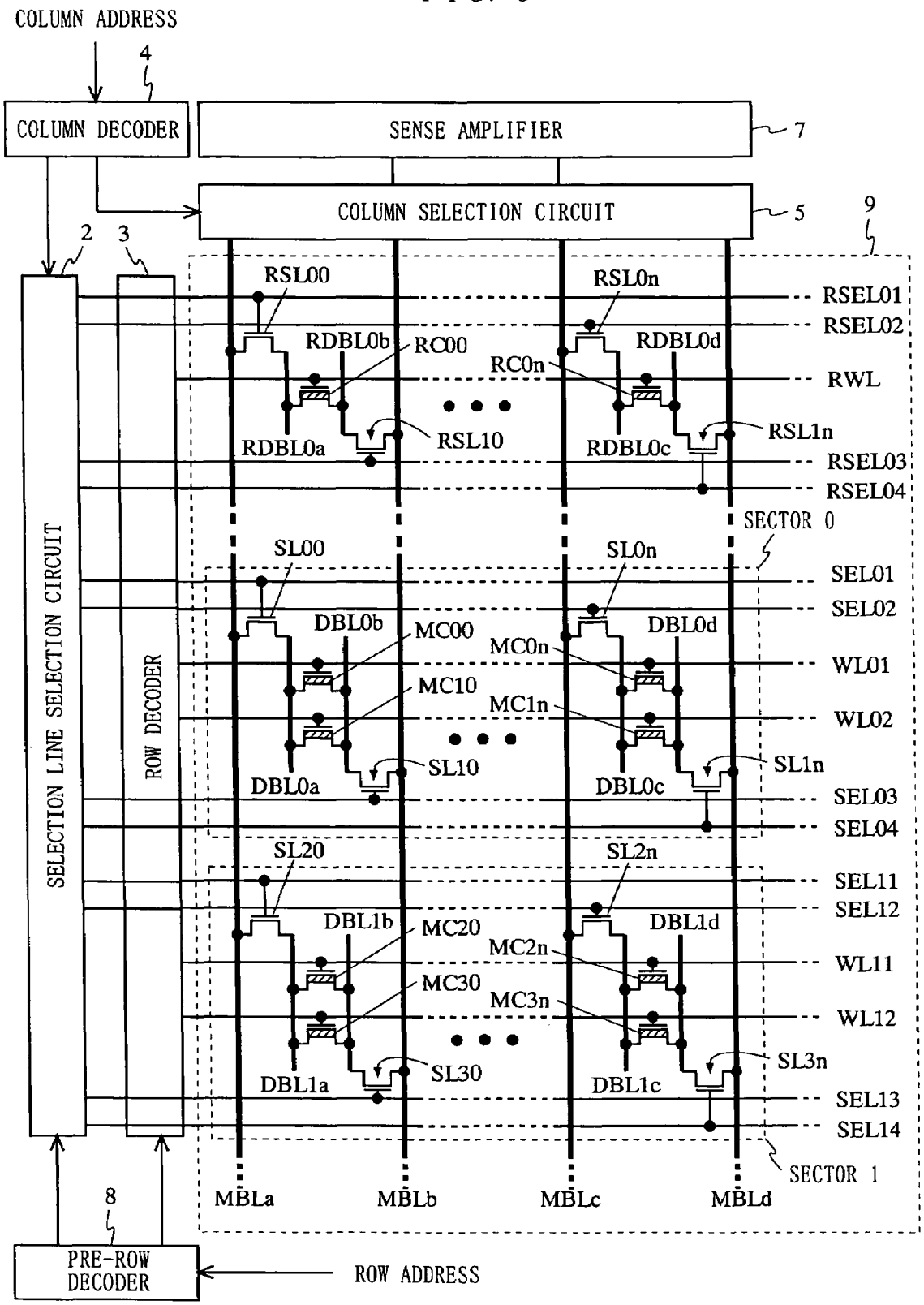
FIG. 3 is a diagram showing the configuration of a non-volatile semiconductor memory device of a second embodiment of the present invention.

Hereinafter, a non-volatile semiconductor memory device of a second embodiment of the present invention will be described with reference to the accompanying drawings. A specific configuration of the non-volatile semiconductor memory device of this embodiment will be described later. The non-volatile semiconductor memory device of this embodiment is the same as the non-volatile semiconductor memory device of the first embodiment, except that the arrangement position of the reference cells is changed. FIG. 3 is a diagram showing the configuration of the non-volatile semiconductor memory device of this embodiment. Also in the non-volatile semiconductor memory device of this embodiment, the read operation will be described.

The non-volatile semiconductor memory device shown in FIG. 3 includes a memory cell area 9, a selection line selection circuit 2, a row decoder 3, a column decoder 4, a column selection circuit 5, a sense amplifier 7 and a pre-row decoder 8. In the memory cell area 9, memory cells MC00 to MC0n, MC10 to MC1n, MC20 to MC2n, MC30 to MC3n, reference cells RC00 to RC0n, and selection transistors SL00 to SL0n, SL10 to SL1n, SL20 to SL2n, SL30 to SL3n, RSL00 to RSL0n, RSL10 to RSL1n are arranged. In the memory cell area 9, as the lines in the column direction, main bit lines MBLa to MBLd and sub-bit lines DBL0a to DBL0d, DBL1a to DBL1d, RDBL0a to RDBL0d are provided, and as the lines in the row direction, selection lines SEL01 to SEL04, SEL11 to SEL14, RSEL01 to RSEL04, word lines WL01, WL02, WL11, WL12, and reference word lines RWL are provided. The memory cell area 9 is divided into a plurality of sectors extending in the row direction. More specifically, in the non-volatile semiconductor memory device shown in FIG. 3, a sector 0 and a sector 1, which are rectangles that are long in the row direction, are aligned in the column direction. Furthermore, an area in which reference cells are to be arranged (hereinafter, referred to as "area X") is provided between the sector 0 and the column selection circuit 5.

The sectors 0 and 1 shown in FIG. 3 are the same as the sectors in FIG. 1 except that the reference cells are replaced by memory cells. Therefore, the area X, which is a difference between this embodiment and the first embodiment, will be described below.

The selection transistors RSL00 to RSL0$n$, RSL10 to RSL1$n$ in the area X connect or disconnect between the main bit lines MBLa to MBLd and the sub-bit lines RDBL0$a$ to RDBL0$d$. For example, the selection transistor RSL00 connects the main bit line MBLa and the sub-bit line RDBL0$a$ when the selection line RSEL01 is activated. The selection transistor RSL10 connects the main bit line MBLb and the sub-bit line RDBL0$b$ when the selection line RSEL03 is activated. The selection transistors other than the above operate in the same manner.

The reference cell RC00 generates a reference voltage the diffusion area of the reference cell RC00 is connected to the sub-bit line RDBL0$a$, RDBL0$b$, and the gate of the reference cell RC00 is connected to the reference word line RWL. The reference cells other than the above operate in the same manner.

The selection line selection circuit 2, the row decoder 3, the column decoder 4, the column selection circuit 5, the sense amplifier 7, and the pre-row decoder 8 are the same as those in the first embodiment, so that they are not further described.

Hereinafter, a method for reading data in the non-volatile semiconductor memory device of this embodiment will be described. As an example, the case of reading data from a memory cell MC00 in the sector 0 will be described. In this case, the main bit lines MBLa to MBLd function as a narrow sense-main bit line, a main virtual GND line, a complementary main bit line, and a complementary main virtual GND line, respectively. Furthermore, the sub-bit lines DBL0$a$, DBL0$b$ function as a narrow sense-sub-bit line and a sub virtual GND line, respectively. The sub-bit lines DBL1$c$, RDBL0$c$ function as complementary sub-bit lines, and the sub-bit lines DBL1$d$, RDBL0$d$ function as complementary sub virtual GND lines.

When reading data from a memory cell MC00 in the sector 0, the selection lines SEL01, SEL03 and the word line WL01 are activated, and thus the memory cell MC00 is selected. This operation of selecting the memory cell is the same as in the first embodiment, so that description thereof is omitted.

An operation of selecting a reference cell disposed in a column different from that for the memory cell MC00 is performed in order to read out a reference voltage simultaneously and independently of the selection of the memory cell MC00. Herein, it is assumed that the reference cell RC0$n$ disposed in the area X is selected. The operation of selecting the reference cell will be described in detail below.

The column selection circuit 5 activates the complementary main bit line MBLc and the complementary main virtual GND line MBLd, based on the column decode signal for selecting the reference cell RC0$n$. The selection line selection circuit 2 activates the selection lines RSEL02, RSEL04, based on the row decode signal for selecting the reference cell RC0$n$. Thus, the complementary main bit line MBLc and the complementary sub-bit line RDBL0$c$ are connected, and the complementary main virtual GND line MBLd and the complementary sub virtual GND line RDBL0$d$ are connected. Furthermore, the row decoder 3 activates the reference word line RWL, based on the row decode signal for selecting the reference cell RC0$n$. Thus, the reference cell RC0$n$ is selected.

Furthermore, the selection line selection circuit 2 activates the selection lines SEL12, SEL14, based on the row decode signal for selecting the reference cell RC0$n$. Thus, the complementary main bit line MBLc and the complementary sub-bit line DBL1$c$ are connected, and the complementary main virtual GND line MBLd and the complementary sub virtual GND line DBL1$d$ are connected. However, the word lines WL02, WL11, WL12 are not activated. By activating these lines in this manner, when the parasitic capacitances of the complementary sub-bit line RDBL0$c$ as seen from the complementary main bit line MBLc or the complementary sub virtual GND line RDBL0$d$ as seen from the complementary main virtual GND line MBLd are sufficiently smaller than the parasitic capacitances of the complementary sub-bit line DBL1$c$ or the complementary sub virtual GND line DBL1$d$, then a balance between the parasitic capacitance associated with the memory cell MC00 side and the parasitic capacitance associated with the reference cell RC0$n$ side, both as seen from the sense amplifier 7, can be achieved.

Figure 4:
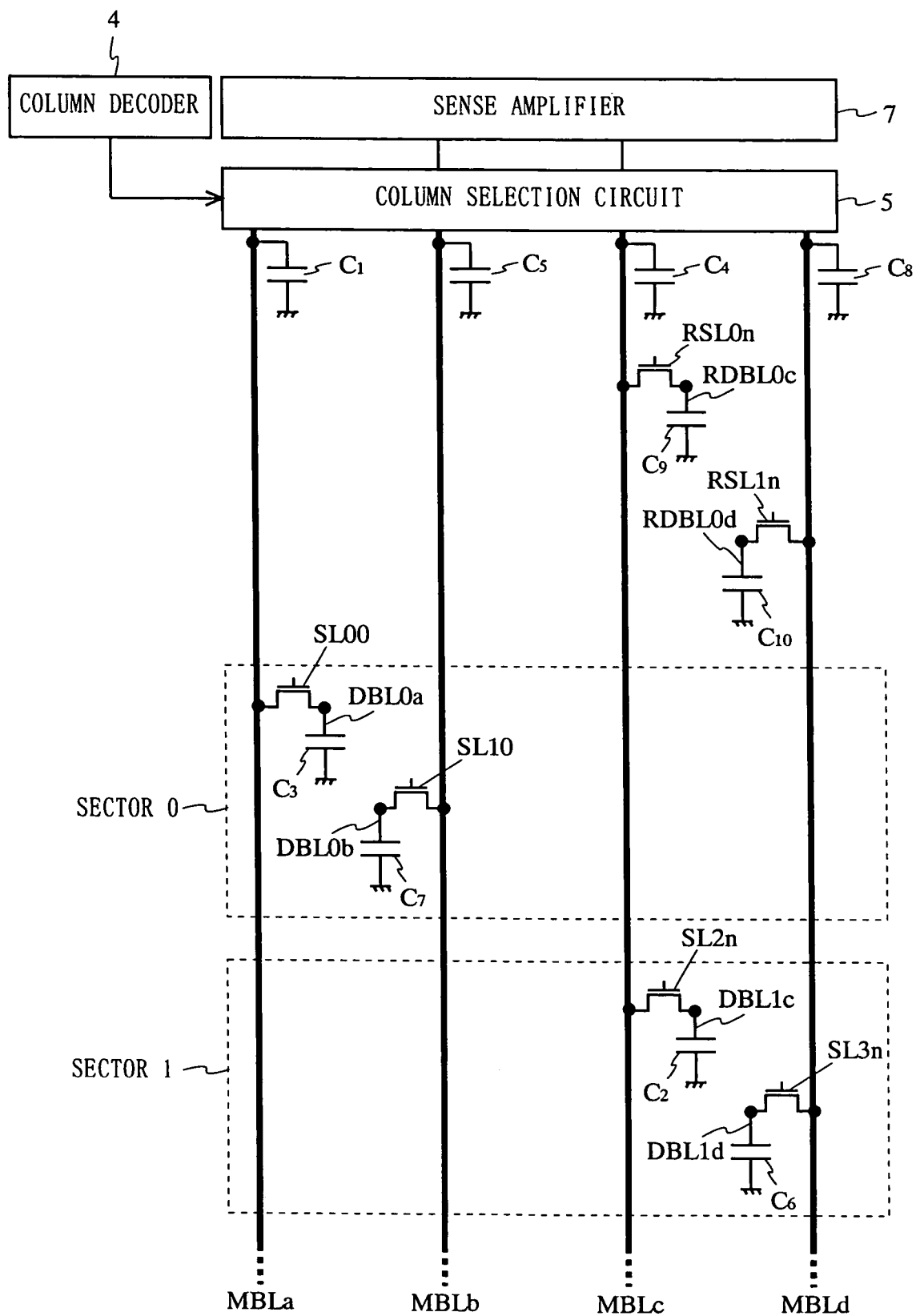
FIG. 4 is a schematic diagram of parasitic capacitances associated with the main bit lines of the memory device shown in FIG. 3.

As described above, according to the non-volatile semiconductor memory device of this embodiment, it is possible to solve the problem of the capacitance unbalance occurring between the memory cell side and the reference cell side as seen from the sense amplifier 7, as in the first embodiment. Hereinafter, the reason for this will be described in detail with reference to the accompanying drawing. FIG. 4 is a schematic diagram of parasitic capacitances associated with the main bit lines MBLa to MBLd when reading data from the memory cell MC00 in the non-volatile semiconductor memory device shown in FIG. 3.

In FIG. 4, $C_1$ denotes a parasitic capacitance of the portion excluding the sector 0, as seen from the narrow sense-main bit line MBLa. $C_2$ denotes a parasitic capacitance of the sector 1, as seen from the complementary main bit line MBLc. $C_3$ denotes a parasitic capacitance of the sector 0, as seen from the narrow sense-main bit line MBLa. $C_4$ denotes a parasitic capacitance of the portion excluding the sector 1 and the area X, as seen from the complementary main bit line MBLc. $C_5$ denotes a parasitic capacitance of the portion excluding the sector 0, as seen from the main virtual GND line MBLb. $C_6$ denotes a parasitic capacitance of the sector 1, as seen from the complementary main virtual GND line MBLd. $C_7$ denotes a parasitic capacitance of the sector 0, as seen from the main virtual GND line MBLb. $C_8$ denotes a parasitic capacitance of the portion excluding the sector 1 and the area X, as seen from the complementary main virtual GND line MBLd. $C_9$ denotes a parasitic capacitance of the area X, as seen from the complementary main bit line MBLc. $C_{10}$ denotes a parasitic capacitance of the area X, as seen from the complementary main virtual GND line MBLd.

Since the area X is sufficiently smaller than the sector 0 or the sector 1, it is believed that the effect of the parasitic capacitances $C_9$ and $C_{10}$ is sufficiently small. When reading data from the memory cell MC00, the selection transistors SL00, SL10, SL2$n$, SL3$n$ are controlled to be ON. Therefore, the parasitic capacitance $C_1$ of the portion excluding the sector 0 as seen from the narrow sense-main bit line MBLa is substantially equal to the parasitic capacitance $C_4$ of the portion excluding the sector 1 as seen from the complementary main bit line MBLc. The parasitic capacitance $C_3$ of the sector 0 as seen from the narrow sense-main bit line MBLa is equal to the parasitic capacitance $C_2$ of the sector 1 as seen from the complementary main bit line MBLc. As a result, the parasitic capacitance associated with the narrow sense-main bit line MBLa as seen from the sense amplifier 7 is substantially equal to the parasitic capacitance associated with the complementary main bit line MBLc as seen from the sense amplifier 7. Thus, the problem of the capacitance unbalance that occurs between the memory cell side and the reference cell side as seen from the sense amplifier 7 can be solved. However, when the parasitic capacitance $C_9$, $C_{10}$ makes up a large ratio in the parasitic capacitances associated with the complementary main bit line MBLc and the complementary main virtual GND line MBLd, the problem of the capacitance unbalance can be solved by adding parasitic capacitances corresponding to the parasitic capacitance $C_9$, $C_{10}$ to the narrow sense-main bit line MBLa and the complementary main virtual GND line MAIN BIT LINES MBLb, respectively.

Furthermore, if the parasitic capacitance of the area X can be equalized with that of another sector (sector 0 or 1), the problem of the capacitance unbalance can be solved by not activating the selection transistors SL2$n$, SL3$n$. The same is true for the capacitance unbalance between the main virtual GND line and the complementary main virtual GND line.

Furthermore, in the non-volatile semiconductor memory device of this embodiment, the complementary main bit line and the complementary main virtual GND line connected to the reference cell are realized by the main bit lines that already have been provided in the memory cell area 9, as in the first embodiment. Therefore, unlike the non-volatile semiconductor memory device disclosed in Reference 3, in the non-volatile semiconductor memory device of this embodiment, it is not necessary to provide anew the complementary main bit line and the complementary main virtual GND line that are to be connected to the reference cell. Therefore, the problem of the capacitance unbalance that occurs between the memory cell side and the reference cell side as seen from the sense amplifier 7 can be solved without increasing the area of the memory cell area 9.

In the non-volatile semiconductor memory device of this embodiment as well as the first embodiment, the reference cell that belongs to the sector different from that for the memory cell to be read and is present in a column different from that for the memory cell is used to generate a reference voltage. Therefore, malfunction of the circuit, which is a problem in conventional non-volatile semiconductor memory device, does not occur.

In the non-volatile semiconductor memory device of this embodiment, the reference cells are arranged outside the sector. Therefore, a stress on the reference cells due to disturbances by an erase operation or a program operation can be reduced. In this embodiment, the cells used as the reference cells in the first embodiment can be used as memory cells, so that the density of the memory cells in the memory cell area can be higher than that in the first embodiment. As a result, the capacity of the non-volatile semiconductor memory device can be increased.

In FIG. 3, the reference cell RC0$n$ is connected to the main bit lines MBLc, MBLd via the selection transistors RSL0$n$, RSL1$n$. However, the form of connection of the reference cell is not limited thereto. For example, also when the current source that supplies a current equal to that of the reference cell RC0$n$ may be connected to the main bit lines MBLc, MBLd, the same effect can be obtained.

(Regarding a Non-volatile Semiconductor Memory Device Including at Least Three Sectors)

Figure 5:
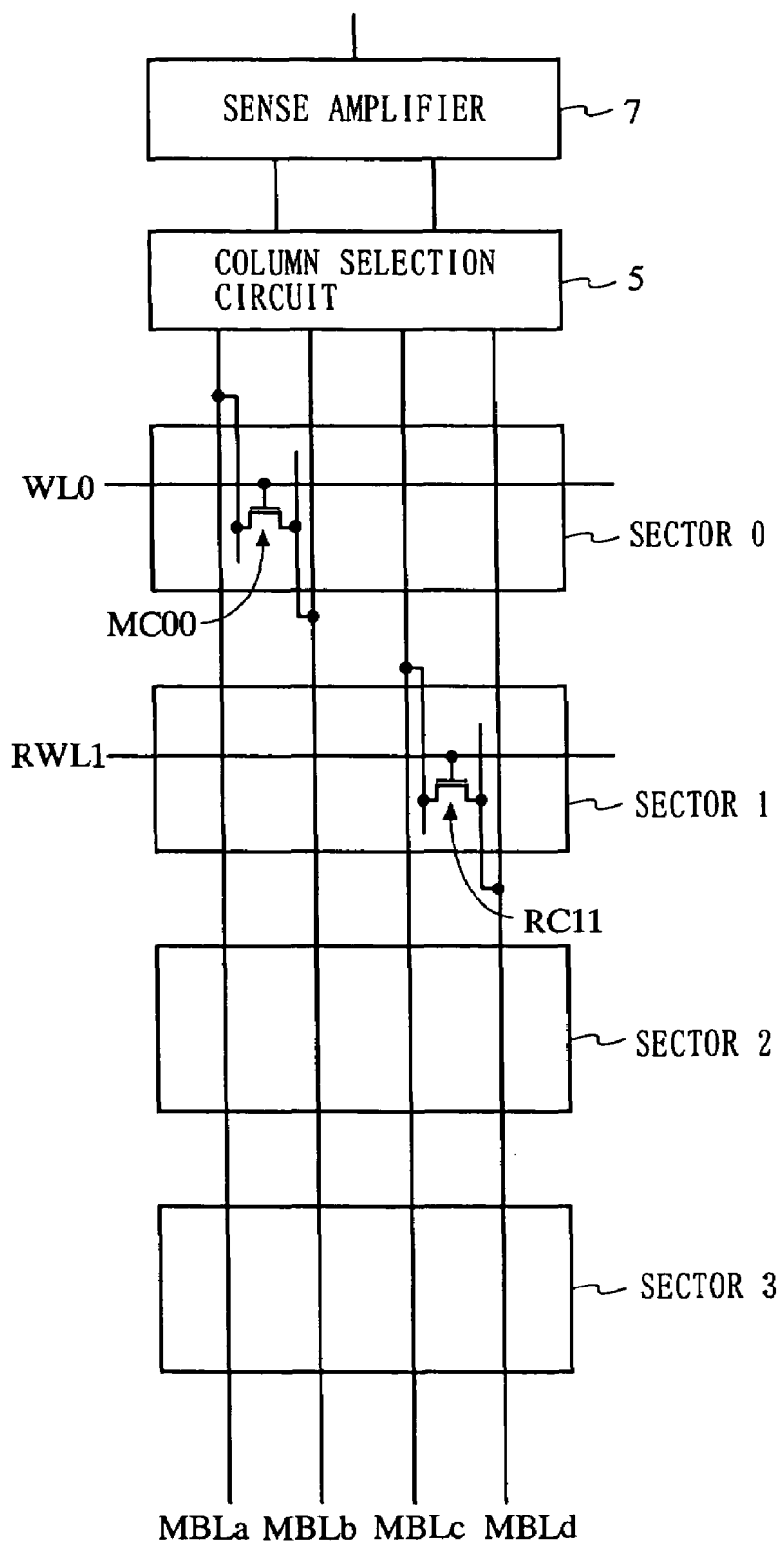
FIG. 5 is a diagram showing the sector configuration of a non-volatile semiconductor memory device having four sectors of the same size.

In the first and the second embodiments, the non-volatile semiconductor memory devices including two sectors have been described for convenience. However, the non-volatile semiconductor memory device may include at least three sectors. Hereinafter, a non-volatile semiconductor memory device including at least three sectors will be described. Herein, a device obtained by modifying a non-volatile semiconductor memory device of the first embodiment so as to include four sectors will be described as an example. FIG. 5 is a diagram showing a sector configuration of this modified non-volatile semiconductor memory device.

In the example shown in FIG. 5, the memory cell area is divided into four sectors having the same structure and the same size (hereinafter, sectors having the same structure and the same size are referred to as "being physically the same"). In FIG. 5, it is assumed that data is read out from the memory cell MC00, and the reference cell RC11 is selected. In this case, a predetermined selection transistor (not shown) is controlled to be ON, so that the drain and the source of the memory cell MC00 are connected to the narrow-sense main bit line MBLa and the main virtual GND line MBLb, respectively, and the drain and the source of the reference cell RC11 are connected to the complementary main bit line MBLc and the complementary main virtual GND line MBLd, respectively. In FIG. 5, unselected memory cells and reference cells are not shown.

In the non-volatile semiconductor memory device shown in FIG. 5, during a read operation, the memory cell and the reference cell are selected respectively from two sectors that are physically the same. Thus, the capacitance unbalance between the narrow sense-main bit line MBLa and the complementary main bit line MBLc as seen from the sense amplifier 7 and the capacitance unbalance between the main virtual GND line MBLb and the complementary main virtual GND line MBLd as seen from the sense amplifier 7 can be reduced.

Herein, for example, when reading data from the memory cell MC00 in the sector 0, it is preferable to select the reference cell RC11 that belongs to the sector 1, which is adjacent to the sector 0, and is present in a column close to the memory cell MC00. Thus, noise or propagation delay due to mismatch of the capacitance or the like or physical positional relationship can be reduced as much as possible.

Figure 6:
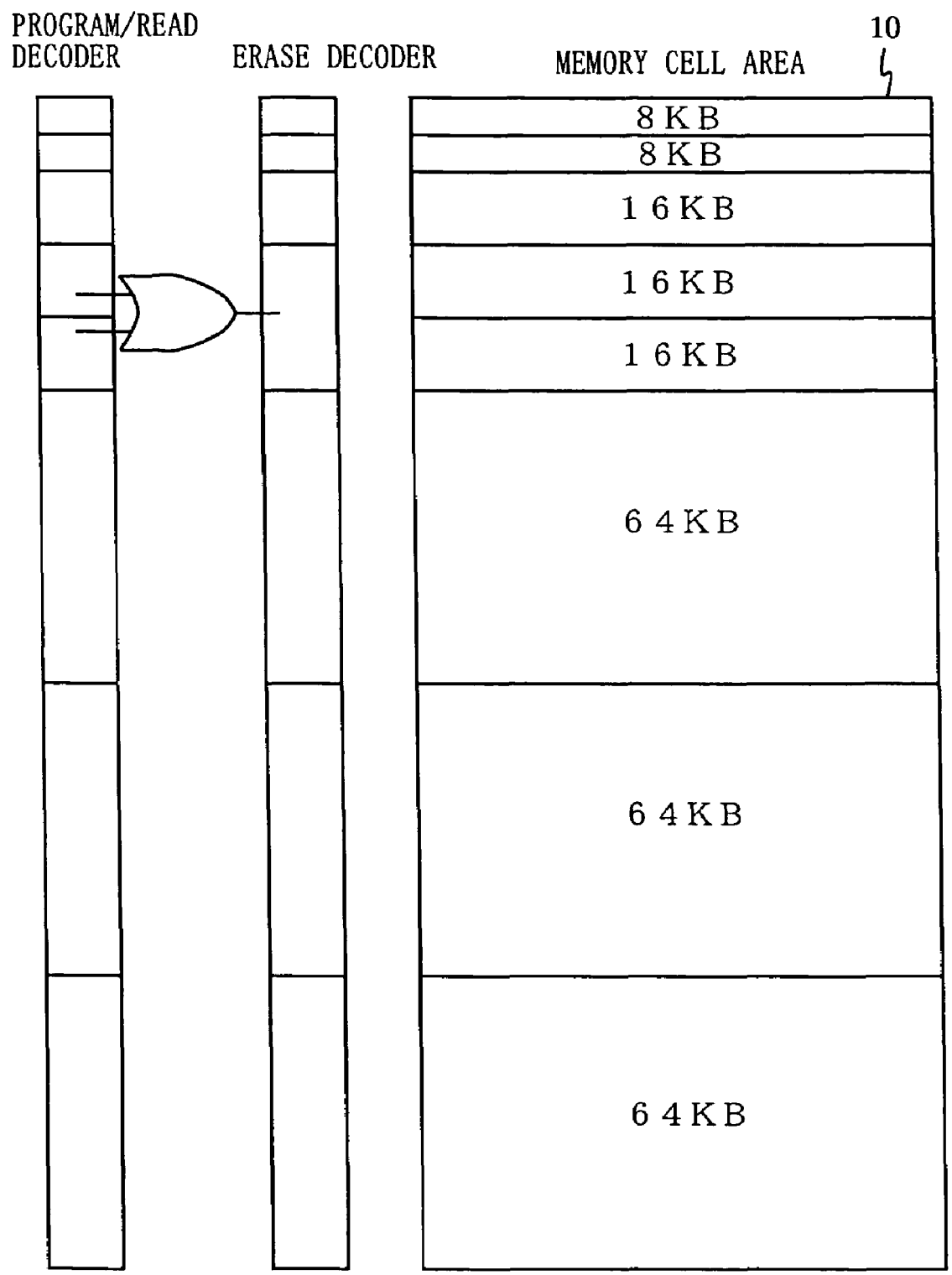
FIG. 6 is a diagram showing the relationship in the size between the sectors and the decoders in the non-volatile semiconductor memory device of the present invention.

Next, as another configuration example of the non-volatile semiconductor memory device in which a plurality of sectors that are physically the same are arranged, the configuration of the memory cell area used for a memory for general purpose will be described with reference to the accompanying drawing. FIG. 6 is a diagram showing the relationship in the size between the sectors and the decoders, regarding the memory cell area of a non-volatile semiconductor memory device having a total memory capacity of 256 KB.

In general, the memory cell area with a memory capacity of 256 KB is divided into seven sectors having capacities of 8 KB, 8 KB, 16 KB, 32 KB, 64 KB, 64 KB, and 64 KB (hereinafter, this division is referred to as normal division). On the other hand, the memory cell area 10 shown in FIG. 6 is divided into eight sectors having capacities of 8 KB, 8 KB, 16 KB, 16 KB, 16 KB, 64 KB, 64 KB, and 64 KB. More specifically, the sector having a capacity of 32 KB in the memory cell area in the normal division is divided into two sectors having a capacity of 16 KB in the memory cell area 10 in FIG. 6. In FIG. 6, program/read decoders are arranged corresponding to the division of the memory cell area 10.

When the memory cell area 10 is divided in the above-described manner, a plurality of sectors having a capacity of 8 KB, sectors of 16 KB, and sectors of 64 KB can be provided. As a result, a read operation in which a balance is made with respect to noise can be realized. More specifically, in the memory cell area divided by the normal division, when reading a memory cell belonging to a sector having a capacity of 32 KB, a reference cell belonging to a sector having an equal capacity cannot be used. Therefore, the problem of the capacitance unbalance cannot be solved.

On the other hand, in the memory cell area 10 shown in FIG. 6, at least two sectors for each sector size are provided. Therefore, the parasitic capacitance associated with the sector to which the memory cell to be read belongs can be matched with the parasitic capacitance associated with the sector to which the reference cell belongs. As a result, a read operation in which a balance is made with respect to noise can be realized.

Furthermore, in general, program/read decoders and erase decoders are arranged corresponding to respective sectors. On the other hand, in a memory cell area 10 shown in FIG. 6, the program/read decoders are arranged corresponding to all the sectors in the memory cell area 10, but the erase decoders are arranged corresponding to sectors except some sectors in the memory cell area 10. More specifically, two program/read decoders and one erase decoder are arranged corresponding to two sectors having a capacity of 16 KB, and the program/read decoders and the erase decoder are connected via an OR circuit. That is to say, a logical OR of selector selection signals input to the program/read decoders is input to the erase decoder. Thus, the division method of the erase decoder as seen from the outside can be the same as that of the memory cell area divided by the normal division. Herein, the memory cell area of 256 KB divided by the normal division has been described above, but the memory capacity and the specific method for division are not limited to those in the above example.

Figure 7:
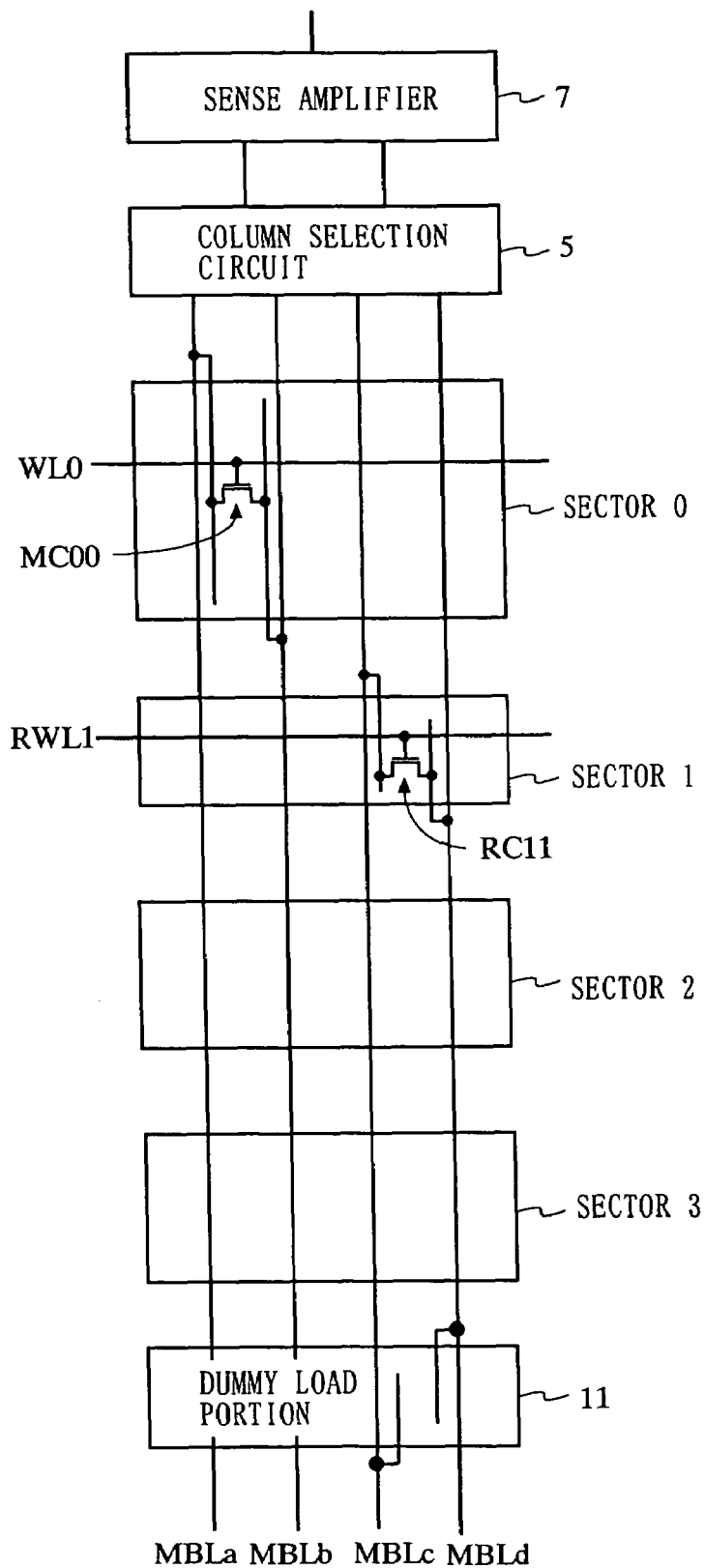
FIG. 7 is a diagram showing the sector configuration of a non-volatile semiconductor memory device having four sectors of different sizes.

The size of the sectors in the memory cell area often depends on the demand of the user. Therefore, all the sectors may not have a uniform size. Therefore, the configuration of the memory cell area divided into sectors of different sizes and the read operation will be described with reference to the accompanying drawings below. FIG. 7 is a diagram showing a sector configuration different from that in FIG. 5.

In the example shown in FIG. 7, the memory cell area is divided into four sectors of different sizes. In FIG. 7, when the sizes of a sector 0 to a sector 3 are denoted by SZ0 to SZ3, respectively, it is assumed that a relationship SZ0>SZ2=SZ3>SZ1 is established. A dummy load portion 11 is provided below the sector 3 as a mechanism for causing a dummy load to be associated. The read operation in a non-volatile semiconductor memory device having such a configuration will be described below. Herein, as an example thereof, the case of reading data from the memory cell MC00 in the sector 0, which is the largest sector, will be described.

First, as described above, the memory cell MC00 to be read is selected. Furthermore, a reference cell RC11 in the sector 1 is selected in order to generate a reference voltage. The size of the sector 0 to which the selected memory cell MC00 belongs is different from the size of the sector 1 to which the reference cell RC11 belongs. Therefore, the capacitance unbalance between the narrow sense-main bit line MBLa and the complementary main bit line MBLc as seen from the sense amplifier 7 and the capacitance unbalance between the main virtual GND line MBLb and the complementary main virtual GND line MBLd remain, and an accurate read operation cannot be performed. In particular, in a verify operation in which it is determined whether or not a memory cell has been programmed/erased to a desired state, a deviation of the optimal operation point of the sense amplifier 7 due to the capacitance unbalance may cause a problem in the reliability of the memory cell.

In the non-volatile semiconductor memory device shown in FIG. 7, a dummy load is connected on the sides of the complementary main bit line MBLc and the complementary main virtual GND line MBLd that are connected to the sector 1, which has a small size. Thus, the parasitic capacitance equal to the parasitic capacitance associated with the sector 0 can be associated with the narrow sense-main bit line MBLa and the main virtual GND line MBLb, and the capacitance unbalance occurring between the memory cell side and the reference cell side can be improved. In particular, during the verify operation, it is effective to cause the dummy load to be associated such that the parasitic capacitance thereof is equal to the parasitic capacitance associated with the largest sector of the plurality of sectors.

The problem of the capacitance unbalance due to the difference in the sector size as described above can be solved by a method other than adding the dummy load. More specifically, the problem of the capacitance unbalance due to the difference in the sector size can be solved by adjusting the amount of current flowing through the reference cell in accordance with the ratio of the sector size. Hereinafter, the method of adjusting the amount of current flowing through the reference cell in accordance with the ratio of the sector size will be described in detail.

(Other Solutions of the Capacitance Unbalance Due to the Difference in the Sector Size)

First, at the time of a read operation, a potential change amount $\Delta V$ at the point of time at which a unit time ($\Delta t$) has passed since discharge started can be expressed by equation (1) below based on equation $I = C \, (dV/dt)$.

$$\Delta V = (\Delta t / C) \cdot I \qquad \text{Equation(1)}$$

where I and C are a reference cell current and a bit line capacitance, respectively.

When it is assumed that the potential change amount $\Delta V$ at a unit time $\Delta t$ is constant, a proportional relationship is established between the reference cell current I and the bit line capacitance C. Therefore, when the capacitance unbalance is caused by the difference in the sector size, the problem of the capacitance unbalance can be solved by adjusting the amount of current flowing through the reference cell. This will be described by taking a specific example below.

For example, in FIG. 7, when reading data from the memory cell MC00 in the sector 0, it is assumed that the reference cell RC11 in the sector 1, which is adjacent thereto, is selected. In this case, since the sector 0 is larger than the sector 1, the parasitic capacitance associated with the memory cell MC00 side is larger that the parasitic capacitance associated with the reference cell RC11 side. Therefore, if a read operation is performed with a reduced amount of current flowing through the reference cell RC11, the capacitance unbalance can be improved.

Figure 8:
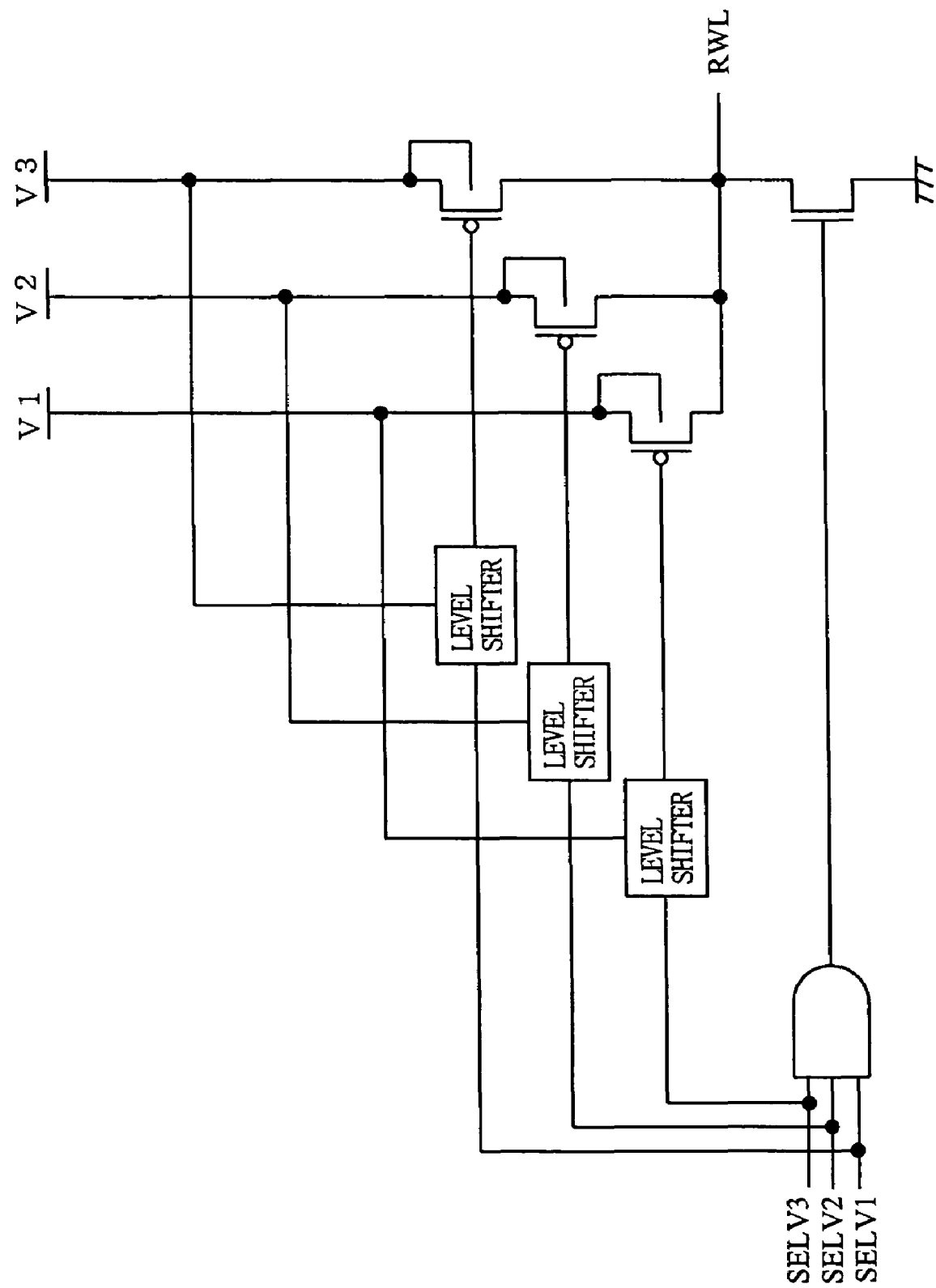
FIG. 8 is a diagram showing a first example of a circuit for adjusting the reference cell current.
Figure 9:
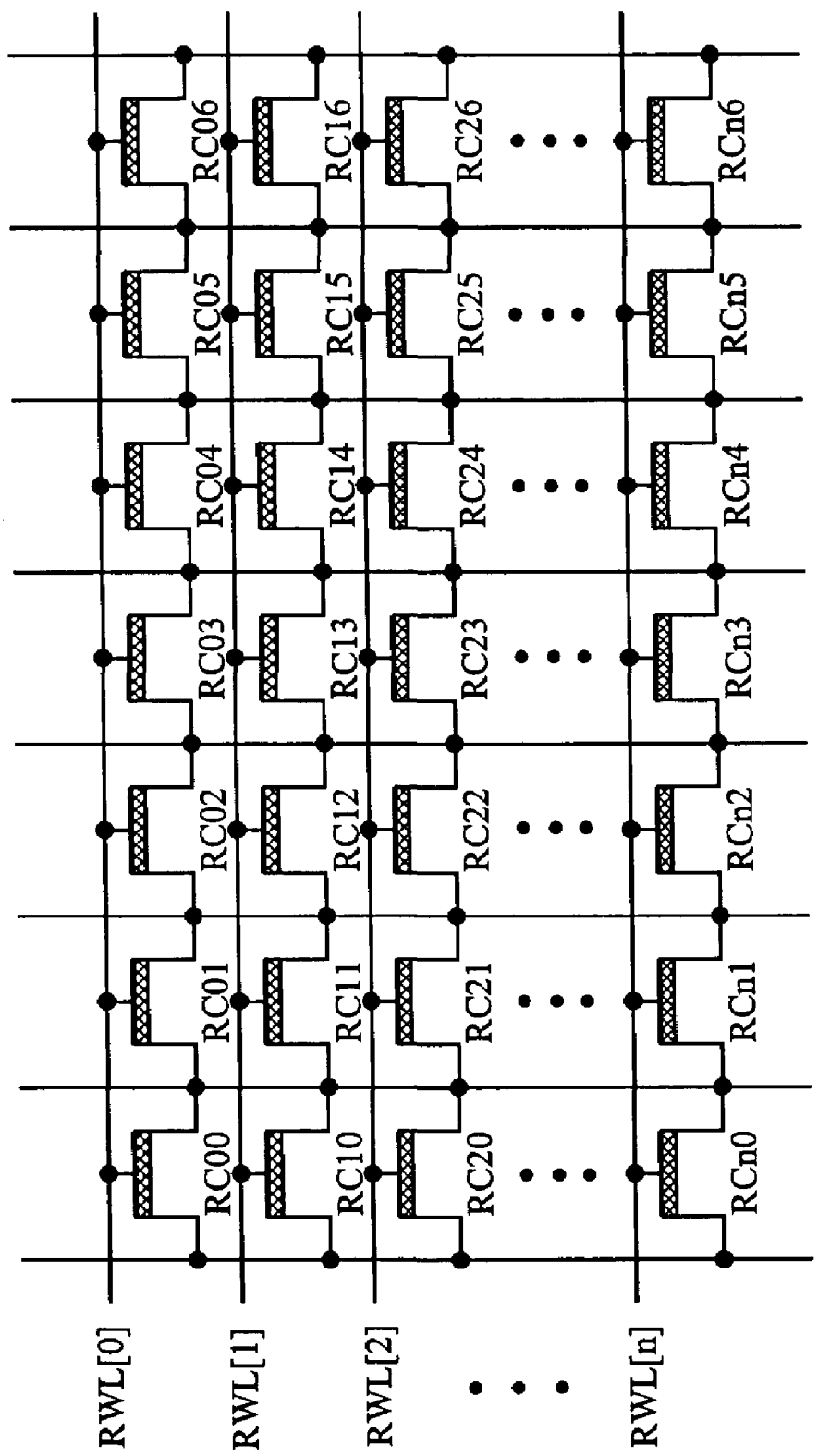
FIG. 9 is a diagram showing a second example of a circuit for adjusting the reference cell current.

As a specific method for adjusting the reference cell current, for example, a circuit shown in FIG. 8 can be used. Three selection signals SELV1 to SELV3 and voltages V1 to V3 (V1<V2<V3) are input to the circuit shown in FIG. 8. The circuit shown in FIG. 8 applies any one of the voltages V1 to V3 to the reference word line RWL based on the selection signals SELV1 to SELV3. Thus, the reference current can be adjusted by controlling the gate voltage of the reference cell. Furthermore, as shown in FIG. 9, the same function can be realized by preparing a plurality of types of reference cells having different current capacities and selecting any one of the reference word line RWL[0] to RWL[n], based on the ratio in the sector size.

By adopting the above-described method, the present invention can be applied to the memory cell divided into sectors having different sizes, so that it is possible to provide main bit lines that serve as a narrow sense-main bit line, a complementary main bit line or the like without providing arrays other than for memory cells in the memory cell area.

Figure 10:
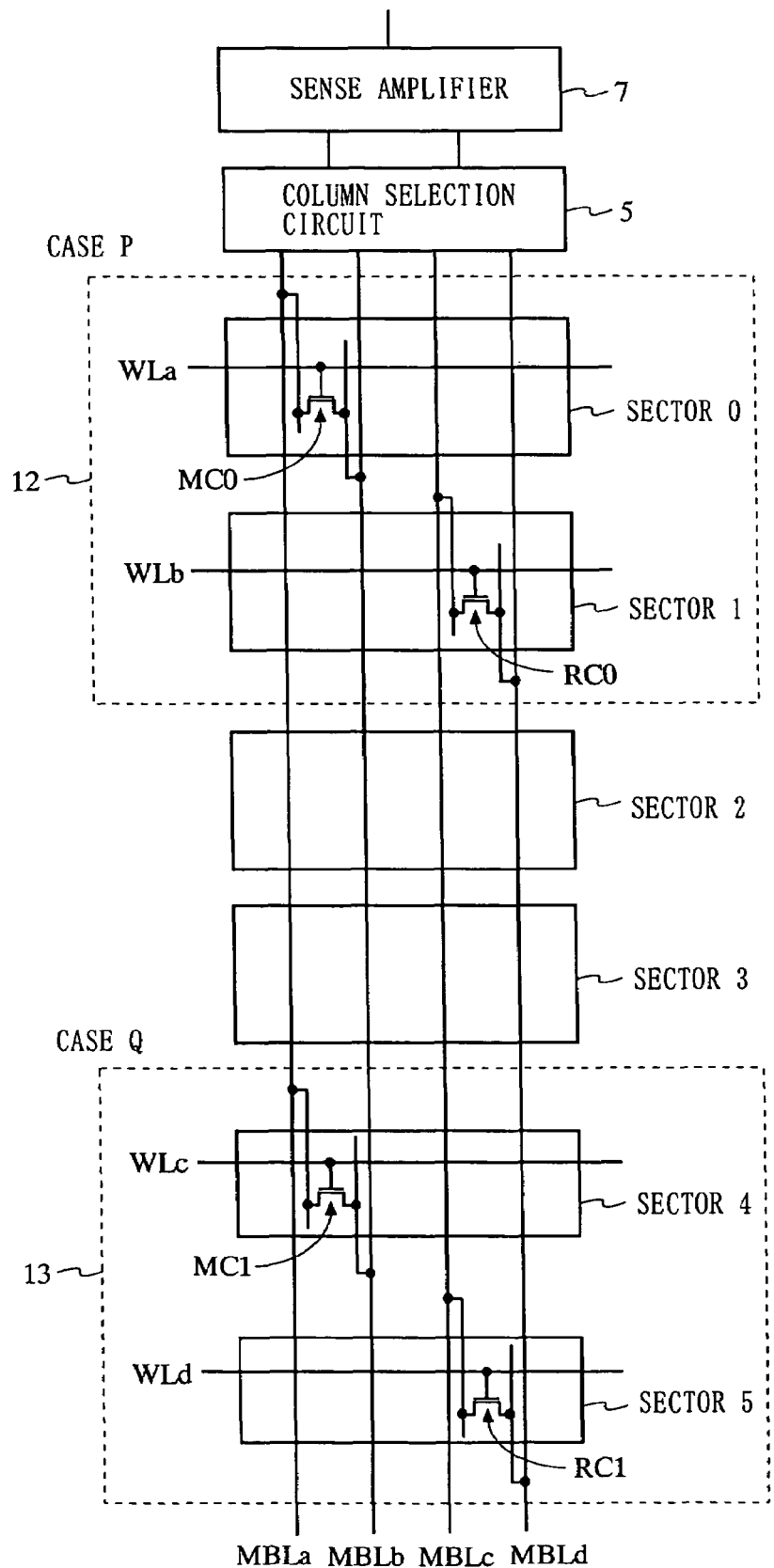
FIG. 10 is a diagram for illustrating a data read in the non-volatile semiconductor memory device including a plurality of sectors of different sizes.
Figure 11:
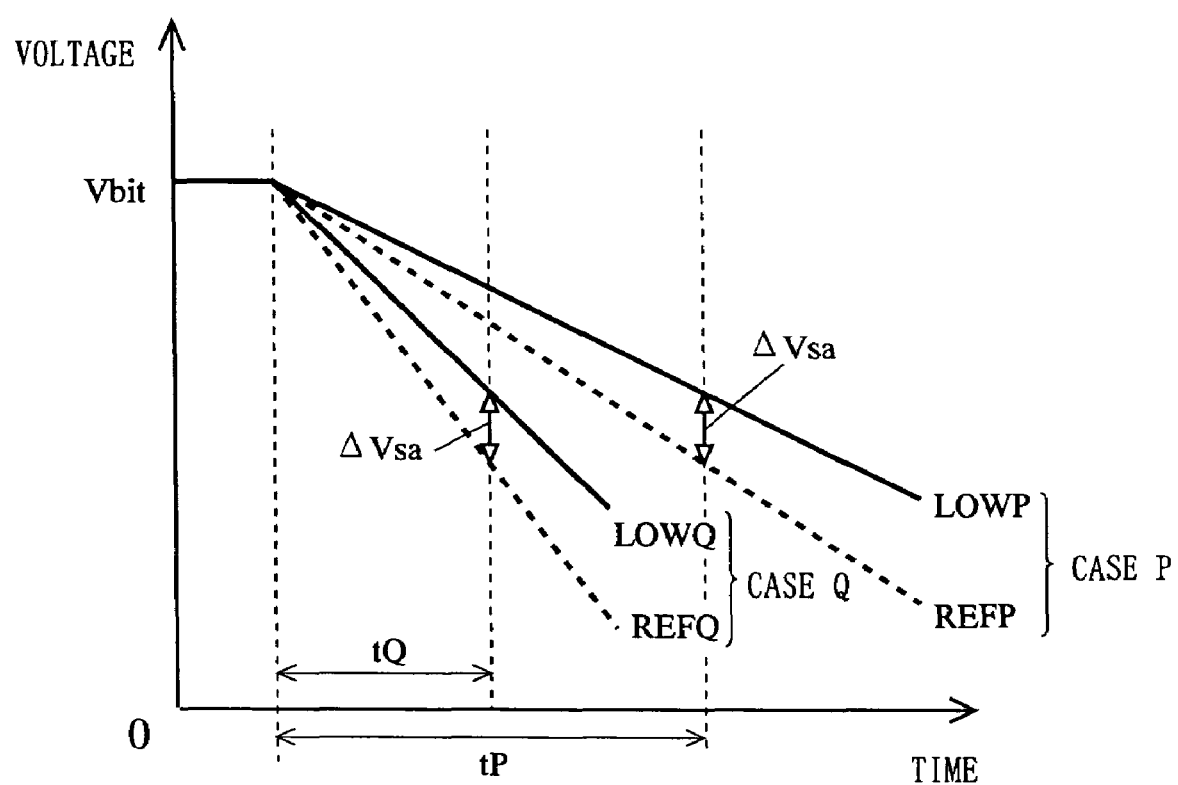
FIG. 11 is a diagram showing waveforms of main bit lines and complementary main bit lines of the non-volatile semiconductor memory device shown in FIG. 10.

FIG. 10 is a diagram for illustrating a data read in a non-volatile semiconductor memory device including a plurality of sectors of different sizes. Hereinafter, reading data from the memory cell MC0 that belongs to the sector 0 is denoted by case P, and reading data from the memory cell MC1 that belongs to the sector 4 is denoted by case Q. FIG. 10 shows the memory cells to be read in the cases P and Q and the reference cells used in the cases P and Q. FIG. 11 is a graph showing waveforms of the narrow sense-main bit line MBLa and the complementary main bit line MBLc in the cases P and Q. In FIG. 11, a solid line LOWP shows a discharge waveform of the narrow sense-main bit line MBLa connected to the memory cell MC0 that is in a low threshold state in the case P, and a broken line REFP shows a discharge waveform of the complementary main bit line MBLc connected to the reference cell RC0 in the case P. A solid line LOWQ shows a discharge waveform of the narrow sense-main bit line MBLa connected to the memory cell MC1 that is in a low threshold state in the case Q, and a broken line REFQ shows a discharge waveform of the complementary main bit line MBLc connected to the reference cell RC1 in the case Q.

In FIG. 10, a box 12 shows that when reading data from the memory cell MC0 belonging to the sector 0, the reference potential of the reference cell RC0 belonging to the sector 1 is used. A box 13 shows that when reading data from the memory cell MC1 belonging to the sector 4, the reference potential of the reference cell RC1 belonging to the sector 5 is used. The read operation of the memory cell MC0 and the read operation of the memory cell MC1 are performed at different timings.

Herein, it is assumed that as shown in FIG. 10, the size of the sector 0 and the sector 1 included in the box 12 is different from the size of the sector 4 and the sector 5 included in the box 13 (More specifically, the former is larger than the latter). In this case, the parasitic capacitances associated with the narrow sense-main bit line MBLa and the complementary main bit line MBLC as seen from the sense amplifier 7 are different between the case P and the case Q. This difference in the parasitic capacitance causes the difference in the sense time of the pair of main bit lines between the case P and the case Q, as shown in FIG. 11. More specifically, the time until the difference between the voltage of the narrow sense-main bit line MBLa and the voltage of the complementary main bit line MBLc reaches the differential voltage ΔVsa at which the sense amplifier 7 can operate optimally is the sense time. The sector 0 and the sector 1 are larger than the sector 4 and the sector 5, so that the parasitic capacitance associated with the pair of main bit lines is larger in the case P than in the case Q. Therefore, as shown in FIG. 11, the sense time in the case Q is tQ, whereas the sense time in the case P is tP, which is longer than tQ. When the sense time is different from sector to sector as stated above, for example, at the point when the time tQ has passed in the case P, the difference between the voltage of the narrow sense-main bit line and the voltage of the complementary main bit line has not reached the differential voltage at which the sense amplifier 7 can operate optimally, which may lead to erroneous determination. Therefore, in this case, the sense timing can be adjusted, based on the ratio in the sector size. This allows the sense amplifier 7 to operate optimally. Consequently, in the non-volatile semiconductor memory device including a plurality of sectors of different sizes, an accurate read operation can be realized while the capacitance unbalance of the narrow sense-main bit line and the complementary main bit line is not substantially present.

(Offset of the Sense Amplifier 7)

Figure 12:
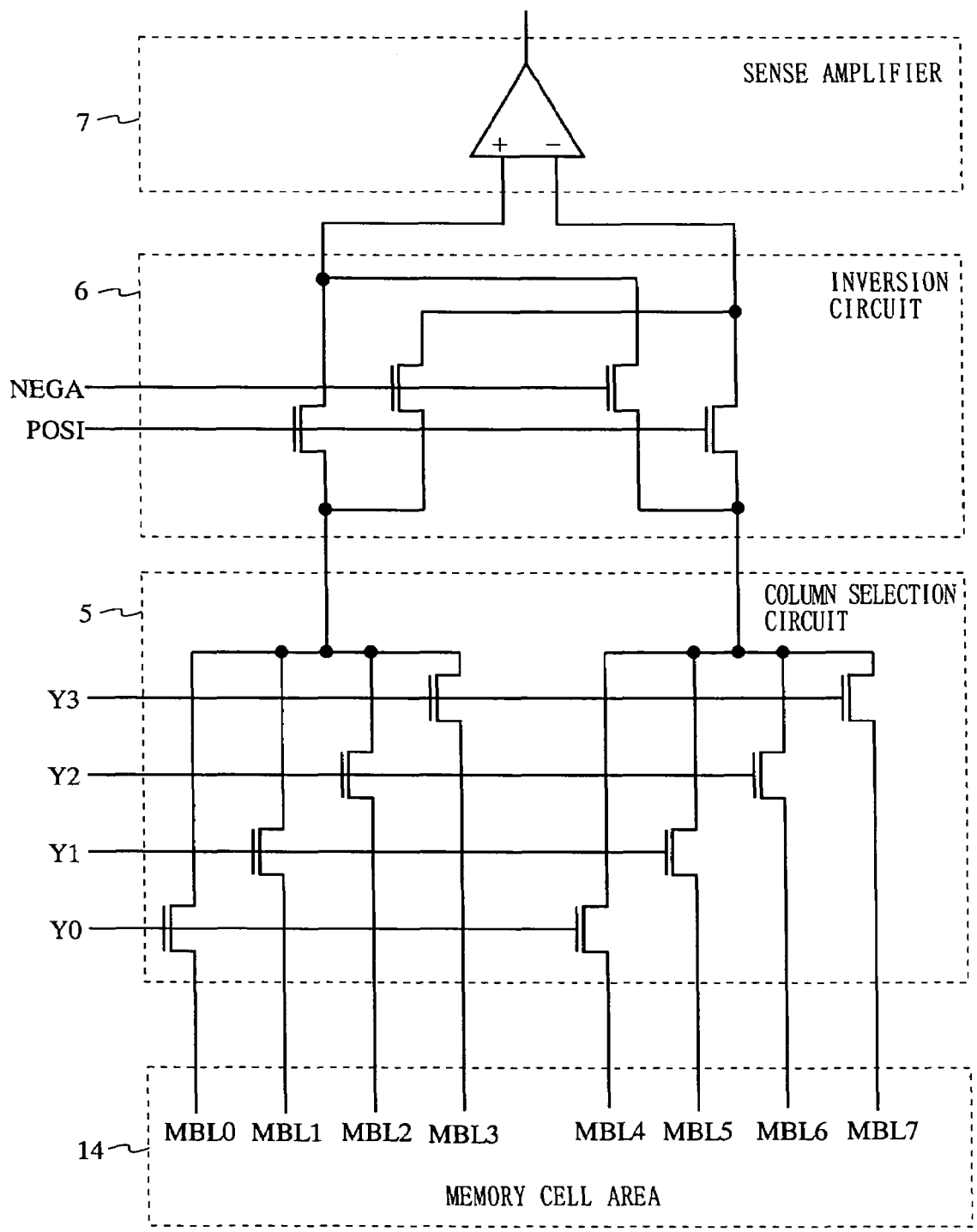
FIG. 12 is a diagram showing detailed configurations of a column selection circuit, an inversion circuit and a sense amplifier of the non-volatile semiconductor memory device of the present invention.

Hereinafter, a method for reducing performance deterioration of the non-volatile semiconductor memory device of the present invention due to the offset of the sense amplifier 7 will be described. FIG. 12 is a diagram showing detailed configurations of the column selection circuit 5, an inversion circuit 6 and the sense amplifier 7 of the non-volatile semiconductor memory device of the present invention.

In a memory cell area 14, a plurality of main bit lines MBL0 to MBL7 are arranged. The number of main bit lines arranged in the memory cell area is not limited thereto. In FIG. 12, sub-bit lines, memory cells and the like are omitted. The column selection circuit 5 selects two main bit lines from the main bit lines MBL0 to MBL7, based on the column selection signals Y0 to Y3. The inversion circuit 6 connects the two main bit lines selected by the column selection circuit 5 to the sense amplifier 7 in a straight manner (positive connection) or a crossing manner (negative connection). Herein, it is assumed that all of the memory cells to be connected to the sense amplifier 7 are connected to any one of the main bit lines MBL0 to MBL7, and in each sector, the sub-bit lines of each sector are connected to respective main bit lines MBL0 to MBL7.

Hereinafter, a method for selecting a bit line will be described. By activating any one signal of the column selection signals Y0 to Y3, any one of the main bit lines MBL0 to MBL3 arranged in the left half of the memory cell area 14 and any one of the main bit lines MBL4 to MBL7 arranged in the right half of the memory cell area 14 are selected. More specifically, when the main bit line MBL0 and a read sub-bit line are connected, the complementary sub-bit line on the reference cell side is connected to the main bit line MBL4. When the main bit line MBL1 and a read sub-bit line are connected, the complementary sub-bit line on the reference cell side is connected to the main bit line MBL5. The same can be applied when the main bit line MBL2 or MBL3 and a read sub-bit line are connected. On the other hand, when the main bit line MBL4 and a read sub-bit line are connected, the complementary sub-bit line on the reference cell side is connected to the main bit line MBL0. When the main bit line MBL5 and a read sub-bit line are connected, the complementary sub-bit line on the reference cell side is connected to the main bit line MBL1. The same can be applied when the main bit line MBL6 or MBL7 and a read sub-bit line are connected.

As described above, one narrow sense-main bit line and one complementary main bit line are selected from the main bit lines arranged in the left half of the memory cell area 14 and the main bit lines arranged in the right half thereof, respectively (one narrow sense-main bit line may be selected from the right half, and one complementary main bit line may be selected from the left half). The selected two main bit lines are connected to the sense amplifier 7 via the inversion circuit 6. In the inversion circuit 6, when a memory cell arranged in the left half of the memory cell area 14 is accessed (that is, the memory cell to be read is connected to any one of the main bit lines MBL0 to MBL3), a positive connection signal POSI is activated. On the other hand, when a memory cell arranged in the right half of the memory cell area 14 is accessed (that is, the memory cell to be read is connected to any one of the main bit lines MBL4 to MBL7), a negative connection signal NEGA is activated. Thus, the memory cell to be read is always connected to the plus input side of the sense amplifier 7.

In a non-volatile semiconductor memory device, it is determined using a sense amplifier whether or not a memory cell has been programmed or erased to an appropriate level of programming or erasing the memory cell. In a commonly used non-volatile semiconductor memory device that is not provided with the inversion circuit 6, output signals from the sense amplifier 7 are distributed in a wide range with a deviation in two directions, that is, the plus direction and the minus direction, due to the offset voltage of the sense amplifier 7. On the other hand, the non-volatile semiconductor memory device shown in FIG. 12, the memory cell to be read is always connected to the plus input side of the sense amplifier 7 by the function of the inversion circuit 6. Therefore, even if the sense amplifier 7 has an offset voltage, output signals from the sense amplifier 7 are deviated only in one direction. Thus, performance deterioration due to the offset of the sense amplifier 7 can be reduced.

(Specific Configuration Examples of the Non-volatile Semiconductor Memory Device)

Hereinafter, some specific configuration examples of the non-volatile semiconductor memory device will be described. The method for reading data from a memory cell includes two types, that is, a read on the drain side and a read on the source side. The method of reading on the drain side refers to a reading method in which a predetermined voltage is applied to the drain of each of the selected memory cell and reference cell, and potential changes in the narrow sense-main bit line and the complementary main bit line that are caused by a difference in the current flowing at that time are determined by the sense amplifier. In this case, because of the VGA configuration, a current leaks into adjacent sub-bit lines via other memory cells and reference cells connected to the drain side of the selected memory cell and reference cell. Therefore, a voltage that is substantially equal to that for the drain of the selected memory cell and reference cell is applied to the adjacent sub-bit lines. Thus, the leakage of current from the adjacent sub-bit lines can be prevented.

On the other hand, the method of reading on the source side refers to a reading method in which a predetermined voltage is applied to the drain side of the selected memory cell and reference cell, and potential changes in the main virtual GND line and the complementary main virtual GND line that are caused by a difference in the current flowing at that time are determined by the sense amplifier.

Figure 13:
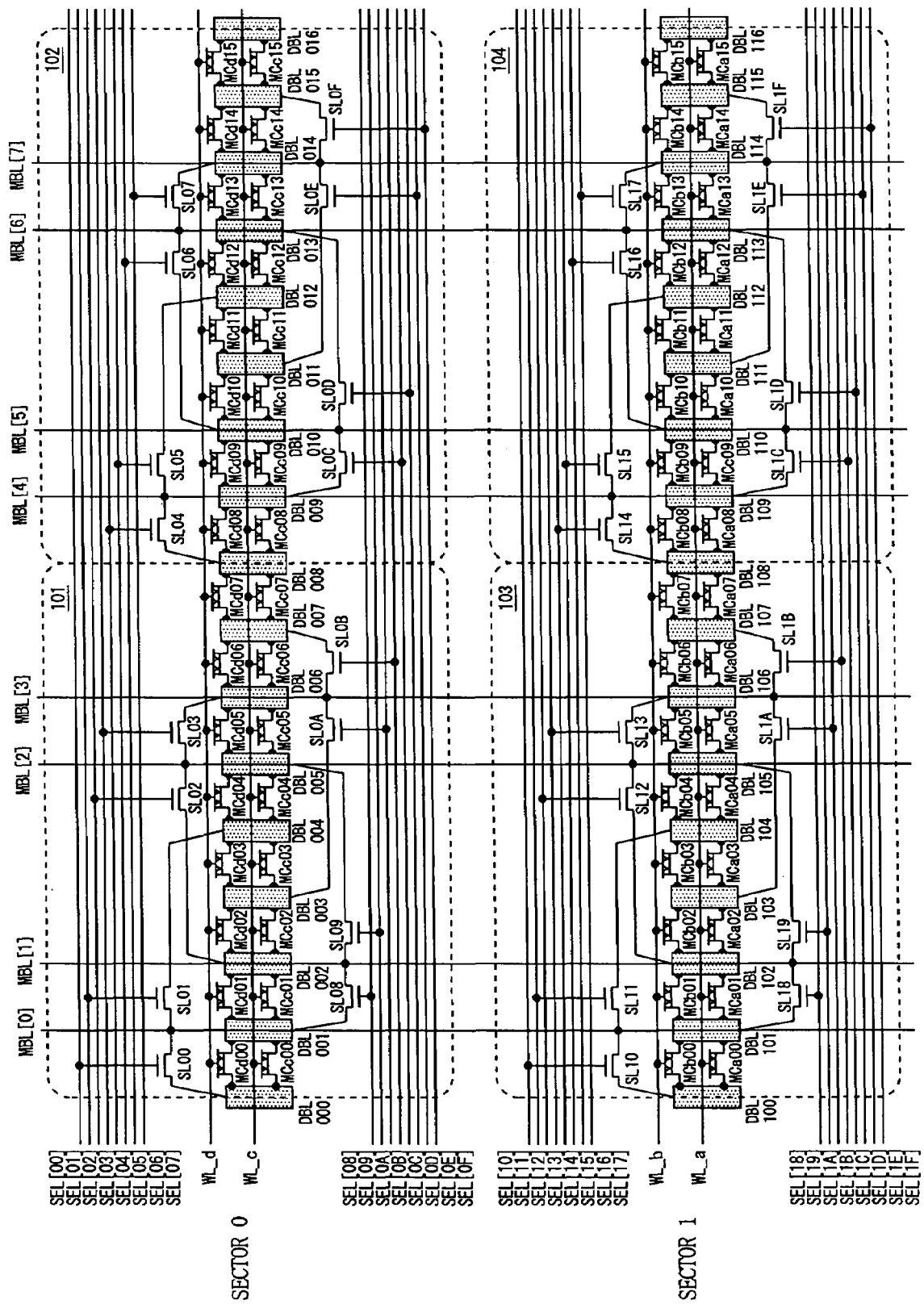
FIG. 13 is a diagram showing a first specific configuration of the non-volatile semiconductor memory device of the present invention.

First, a non-volatile semiconductor memory device that can applied to both the method of reading on the drain side and the method of reading on the source side will be described. FIG. 13 is a diagram showing the configuration of a non-volatile semiconductor memory device of a second embodiment that can be applied to the two reading methods.

The non-volatile semiconductor memory device shown in FIG. 13 is characterized in that the number of selection lines in each sector is twice the number of that in the non-volatile semiconductor memory device disclosed in Reference 1. More specifically, this non-volatile semiconductor memory device includes memory cells MCd00 to MCd15, MCc00 to MCc15 in the sector 0, and memory cells MCb00 to MCb15, Mca00 to Mca15 in the sector 1. This non-volatile semiconductor memory device also includes selection transistors SL00 to SL0F and selection lines SEL[00] to SEL[0F] in order to select a memory cell in the sector 0, and includes selection transistors SL10 to SL1F and selection lines SEL[10] to SEL[1F] in order to select a memory cell in the sector 1. This non-volatile semiconductor memory device also includes main bit lines MBL[0] to MBL[7] and sub-bit lines DBL000 to DBL016, DBL100 to DBL116. The main bit lines MBL[0] to MBL[7] are connected to the column selection circuit 5, which is not shown. The main bit lines MBL[0] to MBL[7] function as a narrow sense-main bit line, a main virtual GND line, a complementary main bit line or a complementary main virtual GND line during a read operation. The sub-bit lines DBL000 to DBL016, DBL100 to DBL116 function as a narrow sense-sub-bit line, a sub virtual GND line, a complementary sub-bit line or a complementary sub virtual GND line during a read operation.

Hereinafter, the configuration of the non-volatile semiconductor memory device shown in FIG. 13 will be described. The main bit lines are connected to the sub-bit lines via the selection transistors. More specifically, two sub-bit lines are connected to one main bit line via selection transistors in each sector. Two memory cells are arranged between adjacent sub-bit lines. When reading on the source side, the configuration may be such that four sub-bit lines are connected to one main bit line via selection transistors in each sector, which is not shown.

Regarding the selection lines, 16 selection lines are arranged in each sector. The selection lines are connected to the selection transistors with a period of 16 lines. Therefore, a sub-bit line can be selected with a period of 16 lines by activating one selection line. The relationship in the number between the main bit lines and the sub-bit lines will be described below. In FIG. 13, the ratio of the number of the main bit lines and the number of the sub-bit lines is 1:2. In each sector, 16 selection lines are provided. These lines are provided because they are necessary to perform the following three processes simultaneously: (a) to prevent a current from leaking into adjacent sub-bit lines during a data read; (b) to control the operation of the selection transistors that connect two sub-bit lines connected to a memory cell to be read and two main bit lines that can be connected to the two sub-bit lines; (c) to control simultaneously and independently the selection transistors that control connections between two main bit lines different from two main bit lines used for a data read and two sub-bit lines that can be connected to the former two main bit lines. When the number of the selection lines is twice as many, the number of selection transistors connected to each selection line can be reduced to a half from a conventional device, which also provides an effect of suppressing an increase of current consumption by driving the selection lines.

It is sufficient that a memory cell can store information of at least 1 bit. For example, if a memory cell is physically configured so as to store 2 bits, that is, one bit on the source side and one bit on the drain side, then it is possible to read data of 2 bits if the roles of the narrow sense main/sub-bit lines and the main/sub virtual GND lines are switched.

In FIG. 13, the reference cells are formed outside the memory cell area. Therefore, the reference cells are not shown in FIG. 13.

The read operation in a non-volatile semiconductor memory device having such a configuration will be described below. Herein, as an example thereof, the case of reading data from a memory cell MCb00 in the sector 1 will be described.

First, the case of reading data by the method of reading on the drain side will be described. In this case, among the two sub-bit lines connected to the memory cell MCb00, the sub-bit line DBL101 functions as the narrow sense-sub-bit line, and the sub-bit line DBL100 functions as the sub virtual GND line. A selection line SEL[18] is activated in order to supply a desired drain voltage from the main bit line MBL[1] to the sub-bit line DBL101 via the selection transistor SL18. A selection line SEL[10] is activated in order to connect the main virtual GND line MBL[0] and the sub virtual GND line DBL100 via the selection transistor SL10. Furthermore, a word line WL_b connected to the gate of the memory cell MCb00 is activated.

As described above, there is the possibility that a current leaks from the narrow sense-sub-bit line DBL101 to the sub-bit line DBL102 via the memory cell MCb01 connected to the same word line WL_b. Therefore, a drain voltage that is substantially equal to the voltage of the narrow sense-sub-bit line DBL101 is supplied to the sub-bit line DBL102. For this, the selection line SEL[12] is activated, so that a drain voltage that is substantially equal to the voltage of the narrow sense-sub-bit line DBL101 is supplied from the main bit line MBL[2] to the sub-bit line DBL102 via the selection transistor SL12. Thus, a current is prevented from leaking to the sub-bit line DBL102.

In parallel to the read operation as above, a reference voltage is read from the reference cell provided outside a memory block 103. Herein, as an example thereof, the case of reading a reference voltage is read from the reference cell connected to the main bit lines MBL[4] and MBL[5] will be described. In this case, sub-bit lines in a memory block 102 included in the sector 0, which is different from the sector 1, are used to match the parasitic capacitances.

In order to connect the complementary main bit line MBL[5] and the complementary sub-bit line DBL009 via a selection transistor SL0C, a selection line SEL[0C] is activated. In order to connect the complementary main virtual GND line MBL[4] and the complementary sub virtual GND line DBL008 via a selection transistor SL04, a selection line SEL[04] is activated.

By the connection method as above, the same configuration as on the side of the memory cell to be read can be realized with the narrow sense-main bit line and the main virtual GND line that are adjacent. As a result, the parasitic capacitances on the memory cell side and the reference cell side as seen from the sense amplifier (not shown) can be substantially equal. Furthermore, it is possible to provide main bit lines that serve as a narrow sense-main bit line, a complementary main bit line or the like without providing arrays other than for memory cells in the memory cell area.

Moreover, a read on the drain side can be performed without a current leaking into an adjacent sub-bit line. Hereinafter, the reason for this will be described. The non-volatile semiconductor memory device shown in FIG. 13 has a larger number of selection lines than those of a conventional non-volatile semiconductor memory device. More specifically, the non-volatile semiconductor memory device shown in FIG. 13 has twice as many selection lines in each sector as those in the non-volatile semiconductor memory device disclosed in Reference 3. Thus, a memory cell can be selected within the range of the memory block 103 included in the sector 1, and it is possible to create a state in which no selection transistor is activated in the memory block 104 that is adjacent thereto in the same sector. Therefore, it is possible to read from the reference cell using the main bit lines MBL[4] to MBL[7] in the adjacent memory block 104.

Next, the case of reading data by the method of reading on the source side will be described. The method for selecting a memory cell and a reference cell by the method of reading on the source side is basically substantially the same as in the method of reading on the drain side, except that a control to prevent a current leakage via the adjacent memory cell is not performed. Hereinafter, this will be described in detail.

When reading data from the memory cell MCb00, among the two sub-bit lines connected to the memory cell MCb00, the sub-bit line DBL101 functions as the narrow sense-sub-bit line, and the sub-bit line DBL100 functions as the sub virtual GND line. A selection line SEL[18] is activated in order to supply a desired drain voltage from the main bit line MBL[1] to the sub-bit line DBL101 via the selection transistor SL18. A selection line SEL[10] is activated in order to connect a main virtual GND line MBL[0] and the sub virtual GND line DBL100 via the selection transistor SL10. Furthermore, a word line WL_b connected to the gate of the memory cell MCb00 is activated. Then, a potential change in the main virtual GND line MBL[0] is detected by the sense amplifier (not shown).

In parallel to the read operation as above, a reference voltage is read from the reference cell provided outside a memory block 103. Herein, as an example thereof, the case of reading a reference voltage is read from the reference cell connected to the main bit lines MBL[4] and MBL[5] will be described. In this case, sub-bit lines in a memory block 102 included in the sector 0, which is different from the sector 1, are used to match the parasitic capacitances.

In order to connect the complementary main bit line MBL[5] and the complementary sub-bit line DBL009 via a selection transistor SL0C, a selection line SEL[0C] is activated. In order to connect the complementary main virtual GND line MBL[4] and the complementary sub virtual GND line DBL008 via a selection transistor SL04, a selection line SEL[04] is activated. Then, a potential change in the complementary main virtual GND line MBL[4] is detected by the sense amplifier (not shown).

Figure 14:
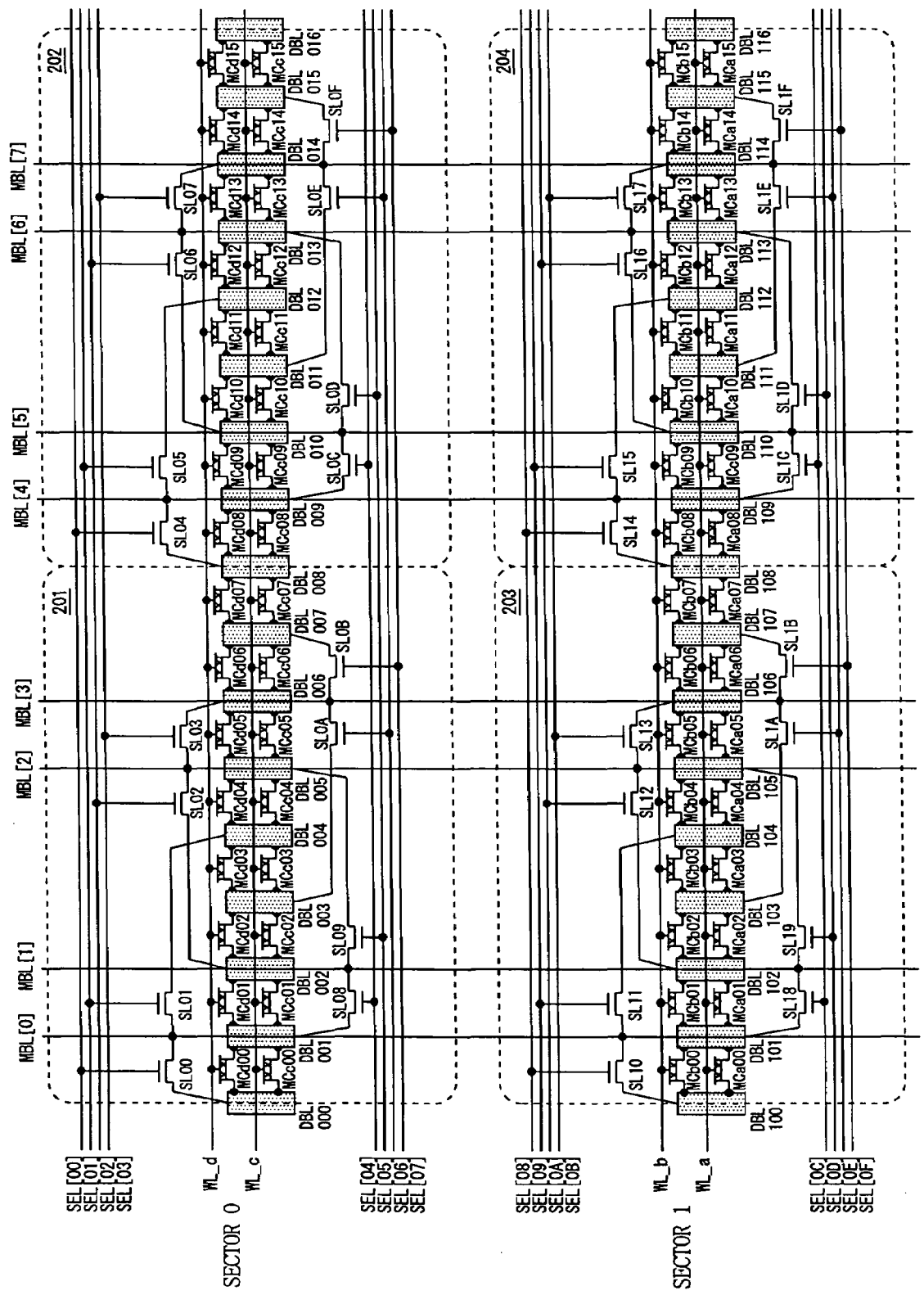
FIG. 14 is a diagram showing a second specific configuration of the non-volatile semiconductor memory device of the present invention.
Figure 15:
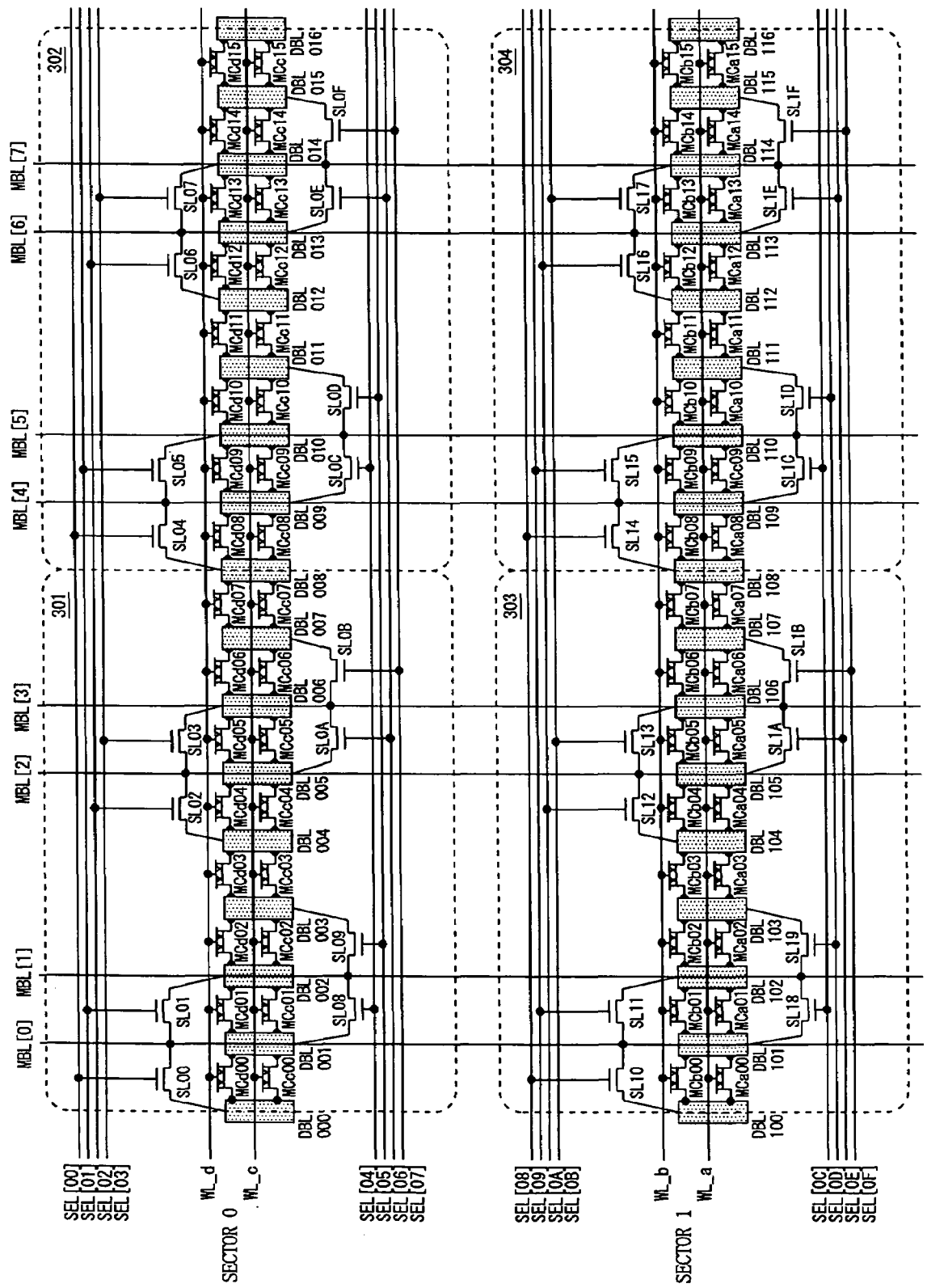
FIG. 15 is a diagram showing a third specific configuration of the non-volatile semiconductor memory device of the present invention.

In this manner, in the non-volatile semiconductor memory device shown in FIG. 13, a read on the source side can be performed. When reading on the source side in the manner as above, it is not necessary to pay attention to current leakage to adjacent sub-bit lines or the like. Therefore, the number of selection lines can be smaller than that shown in FIG. 13. Hereinafter, the configuration of a non-volatile semiconductor memory device that is suitable to a read on the source side will be described with reference to the accompanying drawings. FIGS. 14 and 15 are diagrams each showing the configuration of a non-volatile semiconductor memory device having a smaller number of selection lines.

FIG. 14 is a diagram showing an array configuration in which the number of selection lines is reduced to a half from that in the array configuration shown in FIG. 13. More specifically, the ratio of the number of main bit lines and the number of sub-bit lines is 1:2 in FIG. 14. In each sector, eight selection lines are provided. These lines are provided because they are necessary to perform the following two processes simultaneously: (b) to control the operation of the selection transistors that connect two sub-bit lines connected to a memory cell to be read and two main bit lines that can be connected to the two sub-bit lines; (c) to control simultaneously and independently the selection transistors that control connections between two main bit lines different from two main bit lines used for a data read and two sub-bit lines that can be connected to the former two main bit lines. Thus, when performing a read on the source side, it is not necessary to perform a control to prevent a current leakage via adjacent memory cells, which is performed in the method of reading on the drain side, so that the number of selection lines can be reduced. This makes it possible to reduce the area in which the selection lines are to be arranged, and thus the cost can be reduced.

FIG. 15 is a diagram showing an array configuration obtained by modifying the array configuration of Reference 2. For example, when reading data from the memory cell MCb00, on the memory cell side, the main bit line MBL[1] functions as the narrow sense-main bit line, and the main bit line MBL[0] functions as the main virtual GND line. On the reference cell side, the main bit line MBL[3] functions as the complementary main bit line, and the main bit line MBL[2], which is adjacent thereto, functions as the complementary main virtual GND line. Herein, detailed description of the selection lines is omitted.

Furthermore, when performing a read on the source side, the voltage applied to the selection lines for activating the selection transistors that connect between the sub virtual GND line and the main virtual GND line and between the complementary sub virtual GND line and the complementary main virtual GND line provided on the source side of the selected memory cell and reference cell can be reduced. Thus, power that is consumed by the selection lines can be reduced, and thus a reduction in the area for an internal power and low power consumption can be realized. The reason for this will be described below.

At the time of a read operation, it is necessary to supply a desired drain voltage to the drains of the memory cell and the reference cell. On the other hand, in order to control the transistor constituting the memory cell to be ON, it is necessary to apply a voltage that is higher than the drain voltage by a threshold voltage to the gate. Therefore, it is necessary to apply to the selection lines connected to the selection transistors on the drain side of the memory cell and the reference cell, a voltage equal to or higher than the voltage obtained by adding the threshold voltage of the selection transistor to the desired drain voltage. On the other hand, when performing a read on the source side, the voltage on the source side is in the vicinity of GND level. Therefore, it is not necessary to apply to the selection line of the selection transistor connected to the source side, a voltage that is so high as that applied to the selection line of the selection transistor connected to the drain side. Thus, a reduction in the area for an internal power and low power consumption can be realized by using different voltages to apply to the selection lines between the source side and the drain side.

In the above-described specific examples, in the reference cell side, as well as in the memory cell side, the narrow sense-main bit line and the narrow sense-sub-bit line are connected, and the main virtual GND line and the sub virtual GND line are connected. However, the method of connecting the lines is not limited thereto. This will be described in detail below.

For example, in the non-volatile semiconductor memory device shown in FIG. 13, when performing a read on the source side, in the reference cell side, the complementary main bit line MBL[5] and the complementary sub bit line DBL009 are connected via the selection transistor SL0C, and the complementary main virtual GND line MBL[4] and the complementary sub virtual GND line DBL008 are connected via the selection transistor SL04. However, in reading on the source side, the parasitic capacitance associated with the complementary main virtual GND line MBL[4] is an important element, and the parasitic capacitance associated with the complementary main bit line MBL[5] does not particularly cause a large problem. In FIG. 13, the reference cells are not arranged in the sector 0. Therefore, it is not necessary to connect the complementary main bit line MBL[5] and the complementary sub bit line DBL009.

In such a case, the selection line SEL[0C] is not activated. Thus, by not activating the selection line SEL[0C], low power consumption can be realized.

Figure 16:
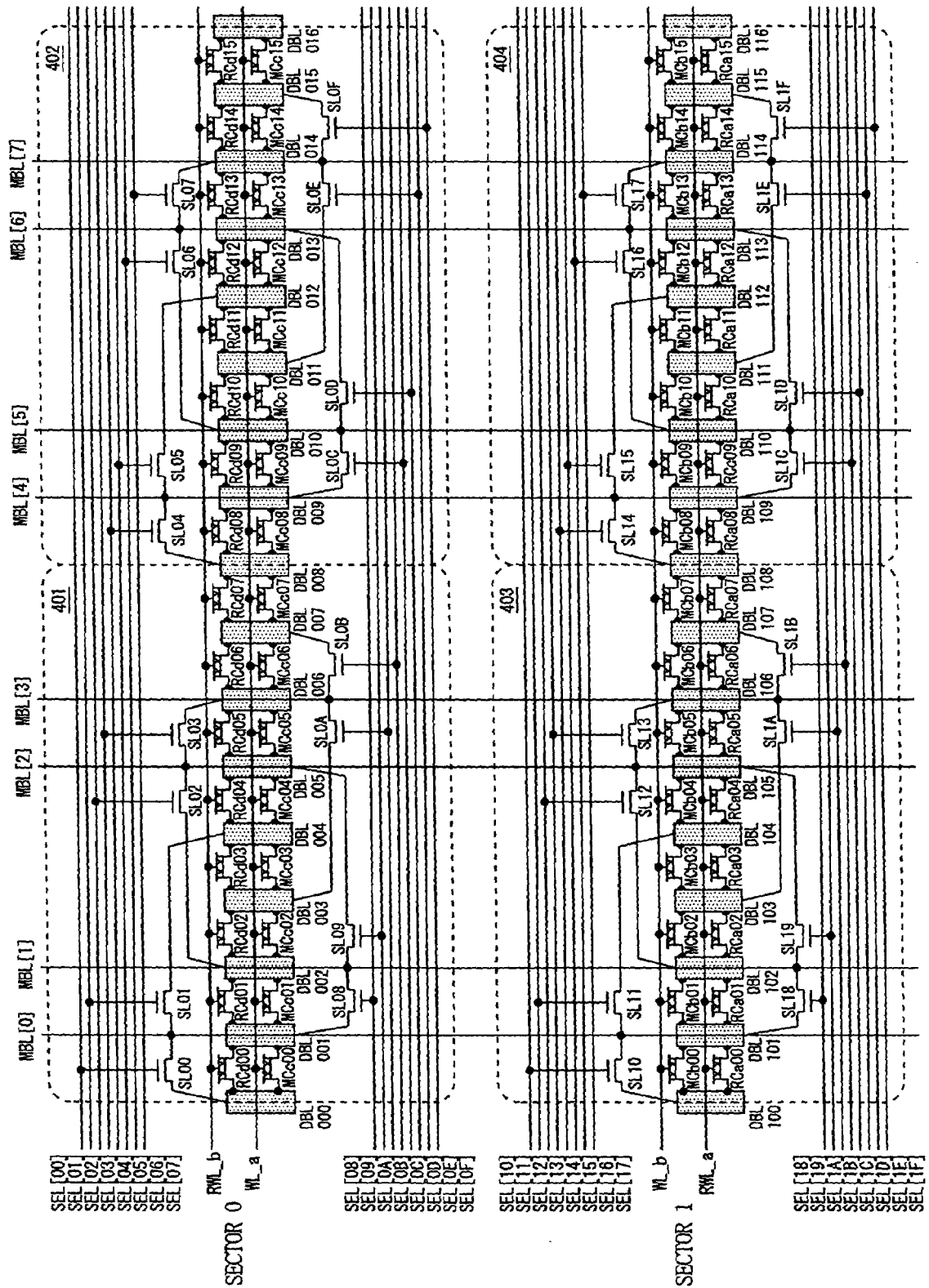
FIG. 16 is a diagram showing a fourth specific configuration of the non-volatile semiconductor memory device of the present invention.
Figure 17:
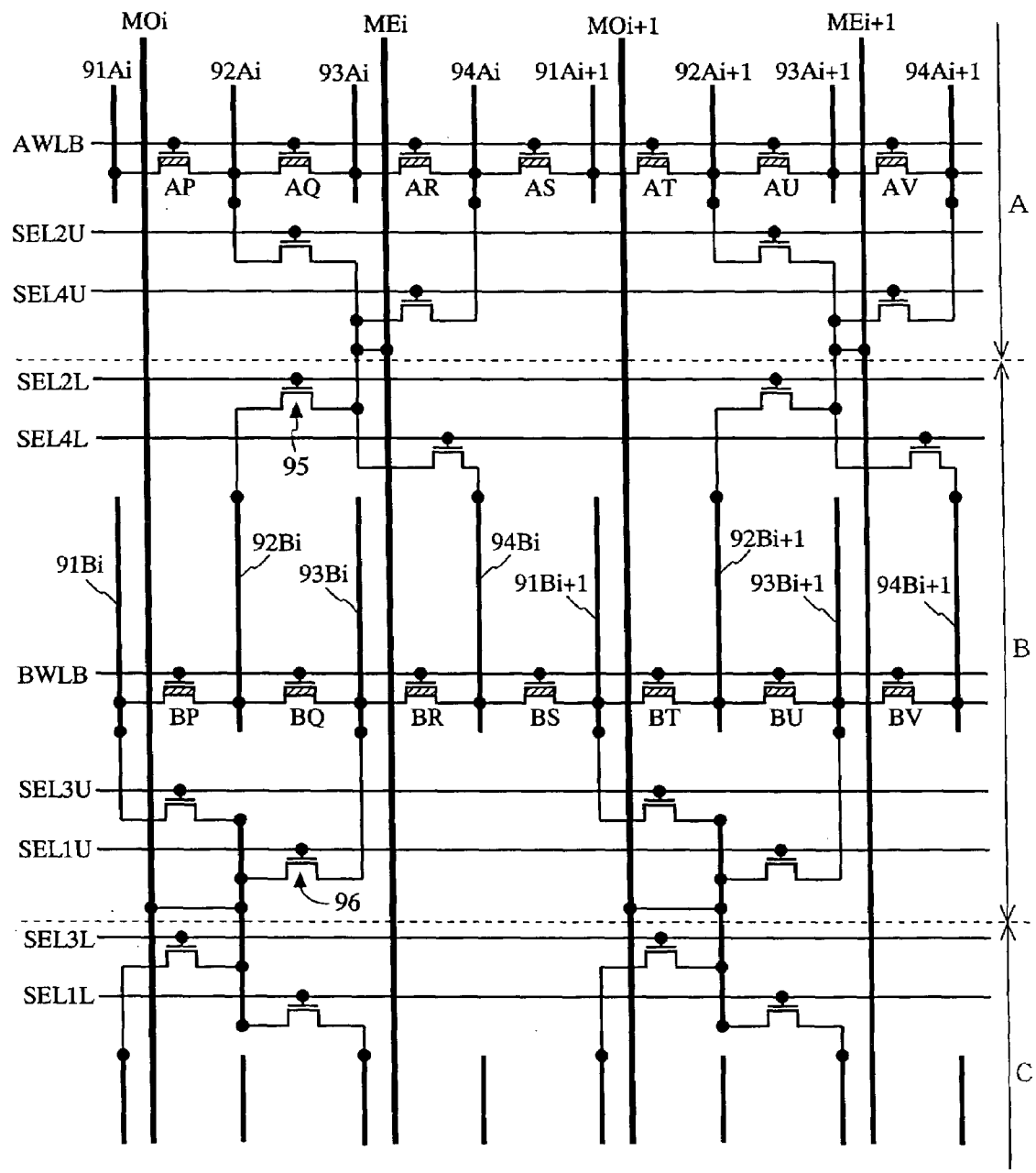
FIG. 17 is a diagram showing a first example of a conventional non-volatile semiconductor memory device.
Figure 18:
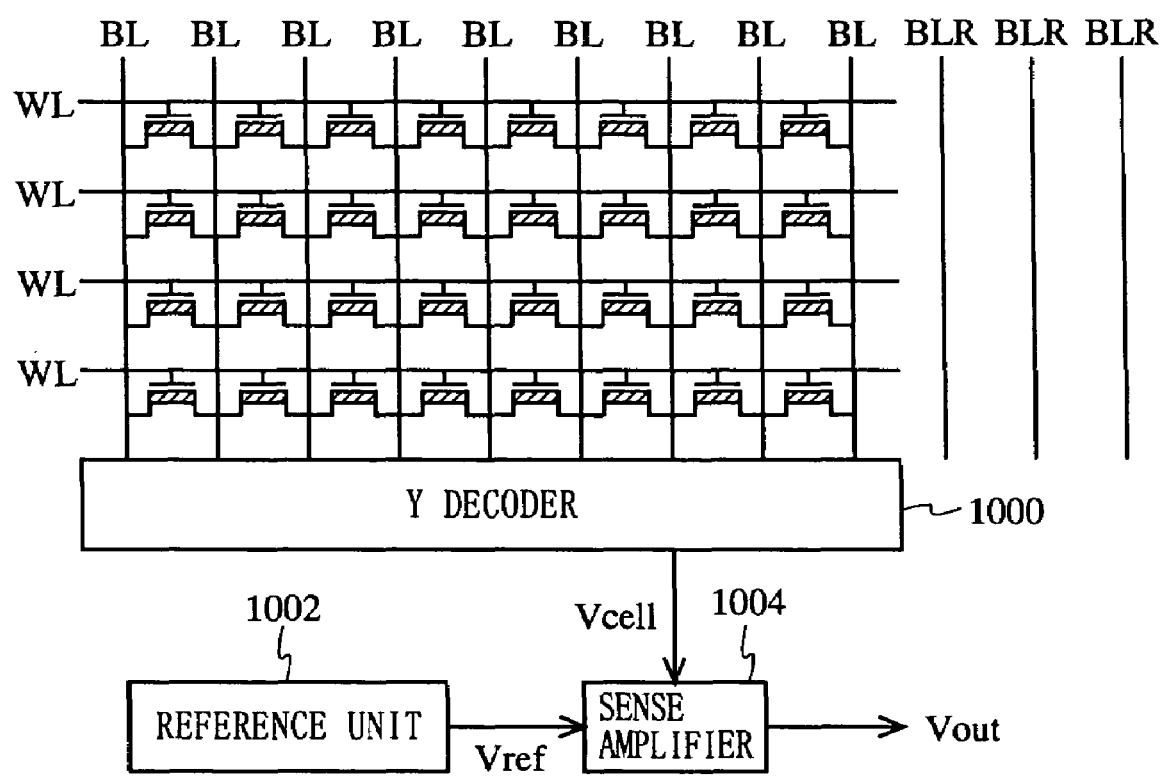
FIG. 18 is a diagram showing a second example of a conventional non-volatile semiconductor memory device.

In the specific configuration examples shown in FIGS. 13 to 15, the reference cells are arranged in a different area than that for the memory cells. However, the arrangement position of the reference cells is not limited thereto. More specifically, as described in the first embodiment, the reference cells can be arranged in a matrix, as the memory cells. In this case, when reading a memory cell in the sector 0, a reference cell in the sector 1 can be selected, and when reading a memory cell in the sector 1, a reference cell in the sector 0 can be selected. Hereinafter, a specific configuration example of the non-volatile semiconductor memory device of the first embodiment will be described. Herein, it is assumed that a read on the source side is performed for the purpose of reducing power consumption during a read operation. FIG. 16 is a diagram showing a specific configuration of the non-volatile semiconductor memory device of the first embodiment.

The non-volatile semiconductor memory device shown in FIG. 16 is different from the non-volatile semiconductor memory device shown in FIG. 13 in the arrangement position of the reference cells. More specifically, in the array configuration shown in FIG. 13, two memory cells are arranged between two adjacent sub-bit lines, whereas in the array configuration shown in FIG. 16, one memory cell and one reference cell are arranged between two adjacent sub-bit lines. Except this aspect, the array configuration shown in FIG. 16 is the same as the array configuration shown in FIG. 13, so that other aspects than that will not be described herein.

Hereinafter, the read operation in the non-volatile semiconductor memory device shown in FIG. 16 will de described. Herein, as an example thereof, the case of reading data simultaneously from two memory cells MCb00, MCb01 will be described. In this case, in order to obtain a reference voltage, reference cells RCd08, RCd09 are selected. According to this read operation, significantly low power consumption can be achieved by reading data simultaneously from two memory cells.

When performing a read as above, among the two sub-bit lines connected to the memory cell MCb00, the sub-bit line DBL101 functions as the narrow sense-sub-bit line, and the sub-bit line DBL100 functions as the sub virtual GND line. Furthermore, among the two sub-bit lines connected to the memory cell MCb01, the sub-bit line DBL101 functions as the narrow sense-sub-bit line, and the sub-bit line DBL102 functions as the sub virtual GND line. A selection line SEL[18] is activated in order to supply a desired drain voltage from the narrow sense-main bit line MBL[1] to the narrow sense-sub-bit line DBL101 via the selection transistor SL18.

On the source side of the memory cell MCb00, a selection line SEL[10] is activated in order to connect the main virtual GND line MBL[0] and the sub virtual GND line DBL100 via the selection transistor SL10. On the source side of the memory cell MCb01, a selection line SEL[12] is activated in order to connect the main virtual GND line MBL[2] and the sub virtual GND line DBL102 via the selection transistor SL12. Furthermore, a word line WL_b commonly connected to the two memory cells MCb00, MCb01 is activated. Thus, data can be read simultaneously from these two memory cells via the main virtual GND line MBL[0] and the main virtual GND line MBL[2] connected to the source side of the two memory cells MCb00, MCb01, respectively by the method of reading on the source side.

In this case, in parallel to reading data from the memory cells, selection of a reference cell is also performed. In the reference cell side, among two sub-bit lines connected to a reference cell RCd08, the sub-bit line DBL009 functions as the narrow sense-sub-bit line, and the sub-bit line DBL008 functions as the sub virtual GND line. Furthermore, regarding two sub-bit lines connected to a reference cell RCd09, the sub-bit line DBL009 functions as the narrow sense-sub-bit line, and the sub-bit line DBL010 functions as the sub virtual GND line. Hereinafter, this case will be described.

On the drain side of the reference cells RCd08, RCd09, a selection line SEL[0C] is activated in order to supply a desired drain voltage from the complementary main bit line MBL[5] to the complementary sub-bit line DBL009 via the selection transistor SL0C.

On the source side of the reference cell RCd08, a selection line SEL[04] is activated in order to connect the complementary main virtual GND line MBL[4] and the complementary sub virtual GND line DBL008 via the selection transistor SL04. On the source side of the reference cell RCd09, a selection line SEL[06] is activated in order to connect the complementary main virtual GND line MBL[6] and the complementary sub virtual GND line DBL010 via the selection transistor SL06. Furthermore, a reference word line RWL_b commonly connected to the reference cells RCd08, RCd09 is activated. Thus, data can be read simultaneously from the two reference cells that use commonly the sub-bit line DBL009 serving as the drain, by the method of reading on the source side.

In a normal reading method, using one main bit line and one sub-bit line, a drain voltage for one memory cell is supplied. On the other hand, according to the above-described reading method, using one main bit line and one sub-bit line, a drain voltage for two memory cells can be supplied. Thus, significantly low power consumption can be achieved.

The connection between the main bit lines and the sub-bit lines via the selection transistors that is described with reference to FIG. 16 is not limited to the above example, but can be performed with respect to all the sub-bit lines.

In the non-volatile semiconductor memory device shown in FIG. 16, the memory cell can store data of at least 1 bit.

In the above, reading on the drain side and reading on the source side of the non-volatile semiconductor memory device including N-channel type memory cells have been described in detail. However, the present invention also can be applied to non-volatile semiconductor memory devices including P-channel type memory cells.

In order to perform a read on the drain side with respect to N-channel type memory cells, a positive read voltage is applied to the drain of a memory cell, and whether or not there is a current flowing through the memory cell is detected on the drain side. In order to perform a read on the source side with respect to N-channel type memory cells, a read voltage that is substantially equal to a ground voltage is applied to the source of a memory cell, and whether or not there is a current flowing through the memory cell is detected on the source side.

On the other hand, regarding P-channel type memory cells, the polarity of the voltage to be applied is opposite (it is necessary that the polarity of the voltage to be applied to the word line is opposite, but description thereof is omitted herein). More specifically, in order to perform a read on the drain side with respect to P-channel type memory cells, a negative read voltage is applied to the drain of a memory cell, and whether or not there is a current flowing through the memory cell is detected on the drain side. In order to perform a read on the source side with respect to P-channel type memory cells, a read voltage that is substantially equal to a ground voltage is applied to the source of a memory cell, and whether or not there is a current flowing through the memory cell is detected on the source side.

The non-volatile semiconductor memory device of the present invention has an effect of determining data accurately while suppressing an area increase of the circuit, and therefore is useful as a non-volatile semiconductor memory device or the like having a matrix-shaped memory cell area in which a plurality of memory cells are arranged in the direction of a plurality of rows and the direction of a plurality of columns.

While the invention has been described in detail, the foregoing description is in all aspects illustrative and not restrictive. It is understood that numerous other modifications and variations can be devised without departing from the scope of the invention.

What is claimed is:

1. A non-volatile semiconductor memory device having a matrix-shaped memory cell area including a plurality of memory cells arranged in a plurality of rows and a plurality of columns, the memory cell area being divided into a plurality of sectors each containing a predetermined number of rows, comprising:
   a column selection circuit for selecting a column in the memory cell area;
   a row selection circuit for selecting a row in the memory cell area;
   a plurality of word lines connected to the row selection circuit, each word line being provided corresponding to each row of memory cells;
   a plurality of main bit lines connected to the column selection circuit, each main bit line extending in the direction of the columns;
   a plurality of sub-bit lines provided in each sector, each sub-bit line extending in the direction of the columns;
   a plurality of selection transistors each provided corresponding to each sub-bit line, each selection transistor being capable of electrically conducting or not electrically conducting between the sub-bit line and a corresponding one of the plurality of main bit lines; and
   a plurality of selection lines extending in the direction of the rows and connected to the row selection circuit, each selection line applying a voltage to control electrodes of corresponding ones of the plurality of selection transistors for switching the selection transistors between a conducting state and a non-conducting state, wherein,
   each memory cell is connected between two adjacent sub-bit lines,
   the row selection circuit selects a word line connected to a memory cell to be read,
   the column selection circuit includes:
       a first selection portion for selecting a first pair of main bit lines and two of the plurality of selection lines, thereby selecting the memory cell to be read; and a second selection portion for selecting a second pair of main bit lines and two other of the plurality of selection lines, thereby selecting a line for reading a reference voltage to be used for data determination, wherein the second pair of main bit lines is different from the first pair of main bit lines, and the two other selection lines are to be used for selecting a sector different from a sector to which the memory cell to be read belongs, and the first and second selection portions perform the respective selections simultaneously and independently of each other.

2. The non-volatile semiconductor memory device according to claim 1, further comprising a plurality of reference cells each generating the reference voltage,
wherein, when data is read from the memory cell to be read, a corresponding one of the plurality of reference cells is connected to the line for reading the reference voltage selected by the second selection portion.

3. The non-volatile semiconductor memory device according to claim 2, wherein,
the plurality of reference cells are disposed outside any sector which contains any memory cells.

4. The non-volatile semiconductor memory device according to claim 2, wherein,
each reference cell is disposed within each sector, the reference cell being connected between two adjacent sub-bit lines.

5. The non-volatile semiconductor memory device according to claim 1, wherein,
as the second pair of main bit lines, the second selection portion selects a pair of main bit lines adjoining the first pair of main bit lines.

6. The non-volatile semiconductor memory device according to claim 1, wherein,
as the two other selection lines, the second selection portion selects selection lines to be used for selecting a sector adjoining the sector to which the memory cell to be read belongs.

7. The non-volatile semiconductor memory device according to claim 1, wherein,
the row selection circuit and the column selection circuit further include an adjustment portion for, if a capacitance associated with the sector to which the memory cell to be read belongs is not equal to a capacitance associated with a sector selected by the selection lines selected by the second selection portion, coupling a capacitive portion to a pair of main bit lines of the sector which is associated wit the smaller capacitance.

8. The non-volatile semiconductor memory device according to claim 2, wherein,
if a capacitance associated with the sector to which the memory cell to be read belongs is not equal to a capacitance associated with a sector selected by the selection lines selected by the second selection portion, the column selection circuit adjusts an amount of current flowing to the reference cell in accordance with a ratio between a parasitic capacitance associated with the first pair of main bit lines and a parasitic capacitance associated with the second pair of main bit lines.

9. The non-volatile semiconductor memory device according to claim 2, wherein,
if a capacitance associated with the sector to which the memory cell to be read belongs is not equal to a capacitance associated with a sector selected by the selection lines selected by the second selection portion, the column selection circuit adjusts a sense timing for the memory cell and the reference cell in accordance with a ratio between the capacitance associated with the sector to which the memory cell to be read belongs and the capacitance associated with the sector selected by the selection lines selected by the second selection portion.

10. The non-volatile semiconductor memory device according to claim 1, wherein,
the row selection circuit and the column selection circuit further include a load capacitance addition portion for, if a capacitance associated with the sector to which the memory cell to be read belongs and a capacitance associated with a sector selected by the selection lines selected by the second selection portion are each smaller than a capacitance associated with another sector in the memory cell area, additionally coupling a capacitive portion to the first pair of main bit lines and the second pair of main bit lines so as to result in a parasitic capacitance which is equal to a capacitance associated wit the largest sector in the memory cell area.

11. The non-volatile semiconductor memory device according to claim 1, wherein,
the sectors are diversified into types of different sizes and structures, such that at least two sectors exist for each type.

12. The non-volatile semiconductor memory device according to claim 11, wherein,
in response to a designation of an address of a memory cell, the row selection circuit and the column selection circuit simultaneously erase data stored in the memory cells contained in a plurality of sectors including the sector to which the memory cell having the designated address belongs.

13. The non-volatile semiconductor memory device according to claim 2, further comprising:
a sense amplifier for detecting a difference between two input voltages,
wherein,
the first pair of main bit lines are composed of a first main bit line and a second main bit line,
the second pair of main bit lines are composed of a third main bit line and a fourth main bit line,
the first selection portion selects signal lines such that:
a drain voltage to be applied to a drain of the memory cell to be read is applied to the first main bit line, and
a voltage which is substantially equal to a ground voltage is applied to the second main bit line,
the second selection portion selects signal lines such that:
the drain voltage to be applied to the drain of the memory cell to be read is applied to the third main bit line, and
a voltage which is substantially equal to the ground voltage is applied to the fourth main bit line, and
the second main bit line and the fourth main bit line are connected to the sense amplifier.

14. The non-volatile semiconductor memory device according to claim 13, wherein,
each reference cell is disposed within each sector, the reference cell being connected between two adjacent sub-bit lines,
the non-volatile semiconductor memory device further comprises a plurality of reference word lines extending in the direction of the rows and connected to the row selection circuit, each reference word line being connected to control electrodes of corresponding ones of the plurality of reference cells, and when data is read from the memory cell to be read, the row selection circuit selects and activates one of the plurality of reference word lines from which to read the reference voltage, while keeping inactive and not selecting the reference word line connected to the sector to which the memory cell to be read belongs.

15. The non-volatile semiconductor memory device according to claim 13, wherein,
the first selection portion selects signal lines such that a voltage which is lower than a voltage applied to a selection line connected to the selection transistor for connecting the first main bit line to a sub-bit line connected to the drain of the memory cell to be read is applied to a selection line connected to the selection transistor for connecting the second main bit line to a sub-bit line connected to a source of the memory cell to be read, and
the second selection portion selects signal lines such that a voltage which is lower than a voltage applied to a selection line connected to the selection transistor for connecting the third main bit line to a sub-bit line connected to a drain of the reference cell is applied to a selection line connected to the selection transistor for connecting the fourth main bit line to a sub-bit line connected to a source of the reference cell.

16. The non-volatile semiconductor memory device according to claim 2, further comprising:
a sense amplifier for detecting a difference between two input voltages,
wherein,
the first pair of main bit lines are composed of a first main bit line and a second main bit line,
the second pair of main bit lines are composed of a third main bit line and a fourth main bit line,
the first selection portion selects signal lines such that:
a drain voltage to be applied to a drain of the memory cell to be read is applied to the first main bit line, and
a voltage which is substantially equal to a ground voltage is applied to the second main bit line,
the second selection portion selects signal lines such that:
a voltage which is substantially equal to the ground voltage is applied to the fourth main bit line, and
a selection line for connecting the third main bit line to a corresponding one of the plurality of sub-bit lines is kept inactive, and
the second main bit line and the fourth main bit line are connected to the sense amplifier.

17. The non-volatile semiconductor memory device according to claim 2, further comprising:
a sense amplifier for detecting a difference between two input voltages,
wherein,
the first pair of main bit lines are composed of a first main bit line and a second main bit line,
the second pair of main bit lines are composed of a third main bit line and a fourth main bit line,
the first selection portion selects signal lines such that:
a voltage which is substantially equal to a drain voltage to be applied to a drain of the memory cell to be read is applied to the first main bit line,
a ground voltage is applied to the second main bit line, and
by further selecting a selection line connected to the selection transistor for connecting the first main bit line to a sub-bit line adjoining a sub-bit line connected to a drain of the memory cell to be read, a voltage is applied via the selection transistor to the sub-bit line adjoining the sub-bit line connected to the drain of the memory cell to be read, the voltage being substantially equal to the drain voltage,
the second selection portion selects signal lines such that:
a voltage which is substantially equal to the drain voltage to be applied to the drain of the memory cell to be read is applied to the third main bit line,
the ground voltage is applied to the fourth main bit line, and
during a data read, by further selecting a selection line connected to the selection transistor for connecting the third main bit line to a sub-bit line adjoining a sub-bit line connected to the third main bit line, a voltage is applied via the selection transistor to the sub-bit line adjoining the sub-bit line connected to the third main bit line, the voltage being substantially equal to the drain voltage, and
the first main bit line and the third main bit line are connected to the sense amplifier.

18. The non-volatile semiconductor memory device according to claim 2, further comprising:
a sense amplifier for detecting a difference between two input voltages,
wherein,
the first pair of main bit lines are composed of a first main bit line and a second main bit line,
the second pair of main bit lines are composed of a third main bit line and a fourth main bit line,
the first selection portion selects signal lines such that:
a voltage which is substantially equal to a drain voltage to be applied to a drain of the memory cell to be read is applied to the first main bit line,
a ground voltage is applied to the second main bit line, and
by further selecting a selection line connected to the selection transistor for connecting the first main bit line to a sub-bit line adjoining a sub-bit line connected to a drain of the memory cell to be read, a voltage is applied via the selection transistor to the sub-bit line adjoining the sub-bit line connected to the drain of the memory cell to be read, the voltage being substantially equal to the drain voltage,
the second selection portion is operable to:
select the third main bit line without applying to the third main bit line a voltage which is substantially equal to the drain voltage to be applied to the drain of the memory cell to be read, and
select signal lines such that the ground voltage is applied to the fourth main bit line, and
during a data read, by further selecting a selection line connected to the selection transistor for connecting the third main bit line to a sub-bit line adjoining a sub-bit line connected to the third main bit line, a voltage is applied via the selection transistor to the sub-bit line adjoining the sub-bit line connected to the third main bit line, the voltage being substantially equal to the drain voltage, and
the first main bit line and the third main bit line are connected to the sense amplifier.

19. The non-volatile semiconductor memory device according to claim 1, further comprising:
first and second sense amplifiers for each detecting a difference between two input voltages,
wherein,
the first pair of main bit lines are composed of a first main bit line and a second main bit line, the second pair of main bit lines are composed of a fourth main bit line and a fifth main bit line, the first selection portion is operable to:
- select signal lines such that:
  - a drain voltage to be applied to a drain of the memory cell to be read is applied to the first main bit line, and
  - a voltage which is substantially equal to a ground voltage is applied to the second main bit line,
- further select a third main bit line adjoining the first main bit line such that a voltage which is substantially equal to the ground voltage is applied to the third main bit line, and
- further select a selection line connected to the selection transistor for connecting the third main bit line to a sub-bit line connected to a source of a memory cell having a drain which is connected to the drain of the memory cell to be read, the second selection portion is operable to:
- select signal lines such that:
  - the drain voltage is applied to the fourth main bit line, and
  - a voltage which is substantially equal to the ground voltage is applied to the fifth main bit line,
- further select a sixth main bit line adjoining the fourth main bit line such that a voltage which is substantially equal to the ground voltage is applied to the sixth main bit line, and
- further select a selection line for selecting the selection transistor for connecting the sixth main bit line to a sub-bit line adjoining the sub-bit line connected to the fifth main bit line, the second main bit line and the fifth main bit line are connected to the first sense amplifier for reading data from the memory cell to be read, and the third main bit line and the sixth main bit line are connected to the second sense amplifier for reading data from the memory cell having a drain which is connected to the drain of the memory cell to be read.

20. The non-volatile semiconductor memory device according to claim 19, further comprising:
- a plurality of reference cells each generating the reference voltage, each reference cell being disposed within each sector and connected between two adjacent sub-bit lines, and
- a plurality of reference word lines extending in the direction of the rows and connected to the row selection circuit, each reference word line being connected to control electrodes of corresponding ones of the plurality of reference cells, wherein, when data is read from the memory cell to be read, a corresponding one of the plurality of reference cells is connected to the line for reading the reference voltage selected by the second selection portion, and when data is read from the memory cell to be read, the row selection circuit selects and activates one of the plurality of reference word lines from which to read the reference voltage, while keeping inactive and not selecting the reference word line connected to the sector to which the memory cell to be read belongs.

21. The non-volatile semiconductor memory device according to claim 1, further comprising:
- a sense amplifier for amplifying a voltage difference between the reference voltage and a voltage on one of the first pair of main bit lines from which to read data, the sense amplifier having inputs of opposite polarities; and
- a polarity inversion circuit for coupling the main bit line from which to read data always to the same one of the inputs of the sense amplifier.

22. The non-volatile semiconductor memory device according to claim 1, wherein the memory cell is capable of storing information of 1 bit or more.

23. A non-volatile semiconductor memory device having a matrix-shaped memory cell area including a plurality of memory cells arranged in a plurality of rows and a plurality of columns, the memory cell area being divided into a plurality of sectors each containing a predetermined number of rows, comprising:
- a plurality of word lines, each provided corresponding to each row of memory cells;
- a plurality of main bit lines, each extending in the direction of the columns;
- a plurality of sub-bit lines provided in each sector, each sub-bit line extending in the direction of the columns;
- a plurality of selection transistors each provided corresponding to each sub-bit line, each selection transistor being capable of electrically conducting or not electrically conducting between the sub-bit line and a corresponding one of the plurality of main bit lines; and
- a plurality of selection lines extending in the direction of the rows, each selection line applying a voltage to control electrodes of corresponding ones of the plurality of selection transistors for switching the selection transistors between a conducting state and a non-conducting state, wherein, each memory cell is connected between two adjacent sub-bit lines, and each sector includes at least as many selection lines as are necessary to control a selection transistor for connecting a first pair of sub-bit lines connected to the memory cell to be read to a first pair of main bit lines capable of being coupled to the first pair of sub-bit lines, and a selection transistor for connecting a second pair of main bit lines to a second pair of sub-bit lines capable of being coupled to the second pair of main bit lines, thereby selecting a line for reading a reference voltage to be used for data determination, wherein the second pair of main bit lines is different from the first pair of main bit lines.

* * * * *

UNITED STATES PATENT AND TRADEMARK OFFICE
CERTIFICATE OF CORRECTION

PATENT NO. : 7,123,510 B2 Page 1 of 1
APPLICATION NO. : 11/058374
DATED : October 17, 2006
INVENTOR(S) : Makoto Kojima et al.

It is certified that error appears in the above-identified patent and that said Letters Patent is hereby corrected as shown below:

In Column 37, Line 1 (Claim 19), change the word "fourth" to --third--;

Line 2 (Claim 19), change the word "fifth" to --fourth--;

Line 10 (Claim 19), change the word "third" to --fifth--;

Line 13 (Claim 19), change the word "third" to --fifth--;

Line 15 (Claim 19), change the word "third" to --fifth--;

Line 21 (Claim 19), change the word "fourth" to --third--;

Line 24 (Claim 19), change the word "fifth" to --fourth--;

Line 25 (Claim 19), change the word "fourth" to --third--;

Line 32 (Claim 19), change the word "fifth" to --fourth--;

Line 33 (Claim 19), change the word "fifth" to --fourth--; and

Line 36 (Claim 36), change the word "third" to --fifth--.

Signed and Sealed this

Seventh Day of July, 2009

JOHN DOLL
*Acting Director of the United States Patent and Trademark Office*